United States Patent [19]

Nakano et al.

[11] Patent Number: 5,698,870
[45] Date of Patent: Dec. 16, 1997

[54] HIGH ELECTRON MOBILITY TRANSISTOR (HEMT) AND PSEUDOMORPHIC HIGH ELECTRON MOBILITY TRANSISTOR (PHEMT) DEVICES WITH SINGLE LAYER INTEGRATED METAL

[75] Inventors: Kenichi Nakano, Beavercreek; Christopher A. Bozada, Dayton; Tony K. Quach, Kettering; Gregory C. DeSalvo, Beavercreek; G. David Via; Ross W. Dettmer, both of Dayton; Charles K. Havasy; James S. Sewell, both of Kettering; John L. Ebel, Beavercreek; James K. Gillespie, Cedarville, all of Ohio

[73] Assignee: The United States of America as represented by the Secretary of the Air Force, Washington, D.C.

[21] Appl. No.: 684,756

[22] Filed: Jul. 22, 1996

[51] Int. Cl.[6] .................. H01L 31/0328; H01L 31/0336; H01L 31/072; H01L 31/109
[52] U.S. Cl. .......................... 257/194; 257/472; 257/744
[58] Field of Search ..................... 257/194, 472, 257/744

[56] References Cited

U.S. PATENT DOCUMENTS

| | | | |
|---|---|---|---|
| 3,764,865 | 10/1973 | Napoli et al. | 317/235 |
| 3,855,690 | 12/1974 | Kim et al. | 29/571 |
| 3,861,024 | 1/1975 | Napoli et al. | 29/579 |
| 3,943,622 | 3/1976 | Kim et al. | 29/579 |
| 4,104,672 | 8/1978 | DiLorenzo et al. | 357/22 |
| 4,961,194 | 10/1990 | Kuroda et al. | 357/22 |
| 5,041,393 | 8/1991 | Ahrens et al. | 437/58 |
| 5,091,759 | 2/1992 | Shih et al. | 357/22 |
| 5,326,995 | 7/1994 | Ohori | 257/194 |
| 5,352,909 | 10/1994 | Hori | 257/76 |

OTHER PUBLICATIONS

"Non–Alloyed Ohmic Contacts to n–GaAs Using Compositionally Graded $In_xGa_{1-x}As$ layers" T. Nittono et al Jap. J. App. Phys 27(1718), 1988.

Ohmic Contacts to n–GaAs Using Graded Band Gap Layers of $Ga_{1-x}In_x As$ Grown by Molecular Beam Epitaxy, authored by J.M. Woodall et al., p. 626 in the J. Vac. Sci. Technol. vol. 19, No. 3, Sep./Oct. 1981.

HEMT with Nonalloyed Ohmic Contacts Using n+ –InGaAs Cap Layer, authored by S. Kuroda et al., p. 389 in the IEEE Electron Device Letters, vol. EDL–8, No. 9, Sep. 1987.

Extremely Low Nonalloyed and Alloyed Contact Resistance Using an InAs Cap Layer on InGaAs by Molecular–Beam Epitaxy, authored by C.K. Peng et al., p. 429 in the J. Appl. Phys. vol. 64, No. 1, Jul. 1, 1988.

Extremely Low Contact Resistances for AlGaAs/GaAs Modulation–Doped Field–Effect Transistor Structures, authored by A. Ketterson et al., p. 2305 in the J. Appl. Phys. vol. 57, No. 6, Mar. 1985.

(List continued on next page.)

*Primary Examiner*—Sara W. Crane
*Assistant Examiner*—Douglas Wille
*Attorney, Agent, or Firm*—Gerald B. Hollins; Thomas L. Kundert

[57] ABSTRACT

A periodic table group III–IV HEMT/PHEMT field-effect transistor device and its fabrication is described. The disclosed fabrication arrangement uses a single metallization for ohmic and Schottky barrier contacts, employs selective etching with a permanent etch stop layer, employs a non-alloyed ohmic contact semiconductor layer and includes a permanent non photoresponsive secondary mask element affording several practical advantages during fabrication and in the completed transistor. The invention includes provisions for both an all-optical lithographic fabrication process and a combined optical and electron beam lithographic process. These concepts are combined to provide a field-effect transistor device of reduced fabrication cost, increased dimensional accuracy and state of the art electrical performance.

25 Claims, 8 Drawing Sheets

OTHER PUBLICATIONS

Single–Cycle Lithography Process for Both Large and Sub–Half Micron Features, authored by J.S. Sewell et al., p. 177 in the SPIE, vol. 1671, 1992.

A Combined Electron Beam/Optical Lithography Process Step for the Fabrication of Sub–Half–Micron–Gate–Length MMIC Chips, authored by J.S. Sewell et al., and appearing in the Conference Proceedings of the Fourth National Technology Transfer Conference and Exposition, Dec. 7–9, 1993, Anaheim, California, NASA Conference Publication 3249, vol. 1, p. 54.

Etch Rates and Selectivities of Citric Acid/Hydrogen Peroxide on GaAs, $Al_{0.3}Ga_{0.7}As$, $In_{0.2}Ga_{0.8}As$, $In_{0.53}Ga_{0.47}As$, $In_{0.52}Al_{0.48}As$, and InP, authored by G.C. DeSalvo et al., p. 831 in the J. Electrochem. Soc., vol. 9, No. 3, Mar. 1992.

Citric Acid Etching of $GaAs_{1-x}Sb_x$, $Al_{0.5}Ga_{0.5}Sb$, and InAs for Heterostructure Device Fabrication, authored by G.C. DeSalvo et al., p. 3526 in the J. Electrochem. Soc., vol. 141, No. 12, Dec. 1994.

High–Performance Self–Aligned p+/n GaAs Epitaxial JFET's Incorporating AlGaAs Etch–Stop Layer, authored by J.K. Abrokwah et al., p. 1529 in the IEEE Transactions on Electron Devices, vol. 37, No. 6, Jun. 1990.

Making a High–Yield, 0.33 Micron, MBE–Based GaAs MMIC Production Process, authored by R.D. Remba et al., p. 90 in the proceedings of the 1994 U.S. Conference on GaAs Manufacturing Technology (MANTECH), May 1994.

Simplified Ohmic and Schottky Contact Formation for Field Effect Transistors Using the Single Layer Integrated Metal Field Effect Transistor (SLIMFET) Process, authored by G.C. DeSalvo et al., p. 314 in the IEEE Transactions on Semiconductor Manufacturing, vol. 8, No. 3, Aug., 1995.

All–Refractory GaAs FET Using Amorphous $TiWSi_x$ Source/Drain Metallization and Graded–$In_xGa_{1-x}As$ Layers, authored by N.A. Papanicolaou et al., p. 7 in the IEEE Electron Device Letters, vol. 15, No. 1, Jan. 1994.

A New Fabrication Technology for AlGaAs/GaAs HEMT LSI's Using InGaAs Nonalloyed Ohmic Contacts, authored by S. Kuroda et al., p. 2196 in the IEEE Transactions on Electron Devices, vol. 36, No. 10, Oct. 1989.

A Highly Manufacturable 0.2 μm AlGaAs/InGaAs PHEMT Fabricated Using the Single–Layer Integrated–Metal FET(SLIMFET) Process, authored by Charles K. Havasy et al., appearing in the IEEE Gallium Arsenide Integrated Circuit Symposium, Conference Proceedings, San Diego, CA, Oct. 1995.

Fig. 3ℓ

HIGH ELECTRON MOBILITY TRANSISTOR (HEMT) AND PSEUDOMORPHIC HIGH ELECTRON MOBILITY TRANSISTOR (PHEMT) DEVICES WITH SINGLE LAYER INTEGRATED METAL

RIGHTS OF THE GOVERNMENT

The invention described herein may be manufactured and used by or for the Government of the United States for all governmental purposes without the payment of any royalty.

CROSS REFERENCE TO RELATED PATENT DOCUMENTS

The present document is somewhat related to the copending and commonly assigned patent application documents "Metal Semiconductor Field-Effect Transistor (MESFET) Device With Single Layer Metal", AFD 00 156, Ser. No. 08/684,759; "Single Layer Integrated Metal Process for Metal Semiconductor Field-Effect Transistor (MESFET)", AFD 00157, Ser. No. 08/684,760; "Single Layer Integrated Metal Process for High Electron Mobility Transistor (HEMT) and Pseudomorphic High Electron Mobility Transistor (PHEMT)" AFD 00082, Ser. No. 08/684,761; "Field-Effect Transistor Process With Semiconductor Mask, Single Layer Integrated Metal, and Dual Etch Stops" AFD 00169, Ser. No. 08/684,755; and "Field-Effect Transistor Device With Single Layer Integrated Metal and Retained Semiconductor Masking" AFD 00170, Ser. No. 08/684,734 which are all filed of even date herewith. The contents of these related applications are hereby incorporated by reference herein.

BACKGROUND OF THE INVENTION

This invention relates to field-effect transistor structure.

The present invention achieves the goal of a field-effect transistor in which a single metallization step provides the gate contact and the source/drain contacts—a single metallization arrangement which does not require separate masking steps for the Schottky barrier gate contact and the source/drain ohmic junction contacts respectively. The invention arises from compromise between several semiconductor device disciplines—including the material growth, device metallization, and material deposition disciplines. The achieved field-effect transistor is technically and economically viable for use in analog transistor applications extending to the microwave and millimeter wave spectral regions for example.

Several features appearing in the present invention also appear in the patent and publication literature in the form of stand-alone concepts, concepts used in a different setting or concepts combined in less than the total form contemplated in the present invention. The present invention is therefore believed to represent a novel and unobvious combination of such features to achieve a useful result. Use of the same metal in parts of the source, drain and gate structure of a field-effect transistor for example appears in a certain form in transistors fabricated some years ago when the self aligned gate structure was new in the art. Examples of this same metal usage appear for example in the two related RCA patents of Napoli et al., U.S. Pat. No. 3,764,865 and U.S. Pat. No. 3,861,024. The same metal concept also appears in the two related Westinghouse patents of Kim, U.S. Pat. No. 3,855,690 and U.S. Pat. No. 3,943,622.

In each of these four patents however, the disclosed transistor involves use of a common metal to connect to an already formed source/drain ohmic contact and to form the Schottky barrier gate contact. In the silicon material used in the devices of these four patents an ohmic contact is moreover achieved with the mere addition of another layer of material and does not require the alloying, annealing and other complexities needed for a group III–V semiconductor device ohmic contact. The present invention is believed distinguished over the; disclosure of these older transistor patents by its use the same metal to actually form the gate contact as to form the source/drain contacts of the transistor. Moreover in the present invention these source/drain contacts are achieved in a non alloyed processing fashion.

The U.S. Pat. No. 4,961,194 of S. Kuroda et al., describes gallium arsenide MESFET and HEMT devices which use the combination of non-alloyed ohmic contacts, same metal electrodes, acetone solvent removal of photoresist coatings, ion implanted device separation areas, selective etching and etch stopping at the surface of a device layer. Although each of these features may be used in the present invention additional concepts not disclosed in the Kuroda et al. patent are also a part of the present invention and provide significant distinction over the Kuroda et al. disclosure. The Kuroda et al. patent for example does not disclose a gate aperture recess received in a gate window nor the precise and time effective termination of etching operations as is accomplished in applicants' invention. In view of the similar areas of work and in the interest of minimizing the size of the present document, the contents of the of S. Kuroda et al. U.S. Pat. No. 4,961,194 patent are hereby incorporated by reference herein.

An article published in the technical literature some years ago is also of interest with respect to the single metal concept and is additionally of interest with respect to the use of non-alloyed ohmic contacts in a field-effect transistor. This article "A New Fabrication Technology for AlGaAs/GaAs HEMT LSI's Using InGaAs Non-alloyed Ohmic Contacts" is also authored by S. Kuroda et al., and appears at page 2196 in the Institute of Electrical and Electronic Engineers Transactions on Electron Devices, Volume 36, number 10, October, 1989. This Kuroda et al. article is in fact of an especially enlightening contrast nature with respect to the present invention, since it teaches the use of a complex etching sequence during formation of certain elements and the present invention avoids use of this sequence in favor of a more practical and less costly procedure.

In a somewhat related situation the technical article "All-Refractory GaAs FET Using Amorphous TiWSi$_x$ Source/Drain Metallization and Graded In$_x$Ga$_{1-x}$As Layers" authored by N. Papanicolaou which appears at page 7 in the Institute of Electrical and Electronic Engineers Electron Devices Letters, volume 15, number 1, January, 1994 discloses the use of non-alloyed ohmic contacts in a gallium arsenide field-effect transistor. The Papanicolaou article however, relates to the fabrication of a high temperature field-effect transistor device, a device having refractory metal elements and involving the use of tungsten metal. The Papanicolaou article also presents an informative discussion of the non-alloyed ohmic contact art.

The textbook "Modern GaAs Processing Methods" authored by Ralph Williams, Artech House, of Boston and London, is of assistance in understanding certain aspects attending the present invention including its relationship with the prior art. In the further interest of minimizing the size of the present document, the contents of the Ralph Williams, Artech House textbook are therefore hereby incorporated by reference herein.

Non-alloyed ohmic contacts are additionally disclosed in several published technical journal articles as follows.

1. Ohmic Contacts to n-GaAs Using Graded Band Gap Layers of $Ga_{1-x}In_xAs$ Grown by Molecular Beam Epitaxy, authored by J. M. Woodall et al., page 626 in the Journal of Vacuum Science Technology, Vol 19, number 3, Sept./Oct. 1981.
2. HEMT with Non-alloyed Ohmic Contacts Using $n^+$ InGaAs Cap Layer, authored by S. Kuroda et al., page 389 in the IEEE Electron Device Letters, Volume EDL-8, number 9, Sept. 1987.
3. Extremely Low Non-alloyed and Alloyed Contact Resistance Using an InAs Cap Layer on InGaAs by Molecular-Beam Epitaxy, authored by C. K. Peng et at., page 429 in the Journal of Applied Physics Volume 64, number 1, Jul. 1, 1988.
4. Non-Alloyed Ohmic Contacts to n-GaAs Using Compositional Graded $InxGa_{1-x}As$ Layers, authored by T. Nittono et al., pages 1718–1722 in the Japanese Journal of Applied Physics, Volume 27, number 9, Sept. 1988.
5. Extremely Low Contact Resistances for AlGaAs/GaAs Modulation-Doped Field-Effect Transistor Structures, authored by A. Ketterson et al, page 2305 in the Journal of Applied. Physics. Volume 57, number 6.

Although each of these documents from the prior art may relate to an aspect of the present invention it is believed that the invention as described herein represents the first combination of the plurality of concepts and compromises necessary to achieve a successful single metal, non-alloyed contact, selective etching-achieved, and secondary mask-inclusive field-effect transistor.

SUMMARY OF THE INVENTION

The present invention provides for the combination of transistor features known in different settings along with a new element into a field-effect transistor of new physical structure and manufacturing process. The invention adds a masking/electrically insulating passivating layer, which is useful in both the fabrication sequence and as an element of the completed transistor. The completed transistor is simplified and lower in cost than standard devices and yet of comparable electrical characteristics. The new transistor may be of several differing field-effect transistor types.

It is an object of the present invention therefore to provide a simplified and lower cost field-effect transistor.

It is another object of the invention to provide a field-effect transistor in which a mask layer used during fabrication etching steps is beneficially allowed to remain in the completed device.

It is another object of the present invention to provide a periodic table group III–V field-effect transistor in which a dielectric material mask layer used during fabrication etching steps is employed as a completed device passivation layer and capacitor dielectric layer.

It is an object of the invention to provide a field-effect transistor of simplified metal structure.

It is an object of the invention to provide a field-effect transistor which includes periodic table group III–V materials of the gallium arsenide, indium phosphide or other types.

It is another object of the present invention to provide a field-effect transistor in which certain lithographic and metal deposition steps for forming a Schottky gate contact element have also formed the transistor drain/source ohmic contact elements.

It is another object of the invention to provide a field-effect transistor improved through the use of indium gallium arsenide cap layer-enabled non-alloyed ohmic contacts of low electrical contact resistance.

It is another object of the invention to provide a field-effect transistor in which a GaAs cap layer is replaced with a cap layer of graded composition.

It is another object of the invention to provide a field-effect transistor in which a dielectric (masking) material permanent secondary mask element is used.

It is another object of the invention to provide a field-effect transistor in which a secondary mask element enables use of non-alloyed ohmic contacts.

It is another object of the invention to provide a field-effect transistor arrangement which is relatively insensitive to process-induced variations and therefore provides material growth characterization capability.

It is another object of the invention to provide a field-effect transistor which provides consistent low resistance electrical contacts.

It is another object of the invention to provide a field-effect transistor in which electrical contact alloying problems and resulting contact variability are avoided.

It is another object of the invention to provide a field-effect transistor which avoids a critical alignment step through use of common ohmic contacts and gate region metallizations.

Additional objects and features of the invention will be understood from the following description and claims and the accompanying drawings.

These and other objects of the invention are achieved by a partially fabricated group III–V semiconductor material field-effect transistor comprising the combination of:

a lowermost-situated group III–V semiconductor material substrate layer;

a group III–V semiconductor material buffer layer overlaying said substrate layer;

a charged carrier conveying group III–V semiconductor material channel layer overlaying said buffer layer;

a group III–V semiconductor material barrier layer, of larger energy bandgap than said channel semiconductor material layer, overlaying said channel layer;

a layer of ohmic contact group III–V semiconductor material, of metal-like small energy bandgap, overlaying said barrier layer;

a gate contact member of first metallic composition received on said barrier layer in a gate aperture recession region of said ohmic contact layer, said first metallic composition gate contact member being of a Schottky barrier electrical characteristic with respect to said barrier layer semiconductor material;

source and drain contact members of said same first metallic composition received on said ohmic contact group III–V semiconductor material layer in laterally opposed locations with respect to said gate contact member, said source and drain contact members being of inherently ohmic and linear current-voltage electrical characteristic with respect to said semiconductor material of said ohmic contact layer;

an electrical insulating/secondary mask/photo-insensitive passivation layer received over said ohmic contact group III–V semiconductor material layer in regions surrounding said source, drain and gate contact member recessions;

a photoresist primary mask member layer received over said electrical insulating/secondary mask/photo-insensitive passivation layer in regions surrounding said source, drain and gate contact member recessions; and a lift-off metallic conductor layer of said same first metallic composition incidentally overlaying said photoresist primary mask member layer in regions surrounding said source, drain and gate contact member recessions.

DETAILED DESCRIPTION

Figure 1:
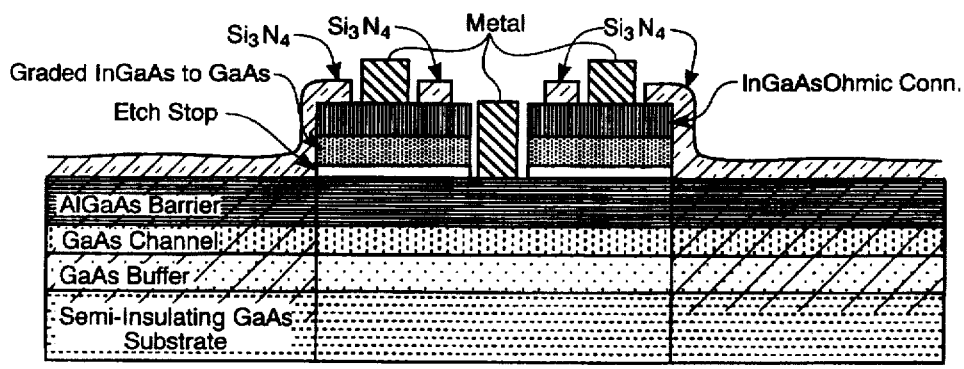
FIG. 1 shows a cross sectional layer view of a High Electron Mobility transistor (HEMT) in accordance with the invention.
Figure 2:
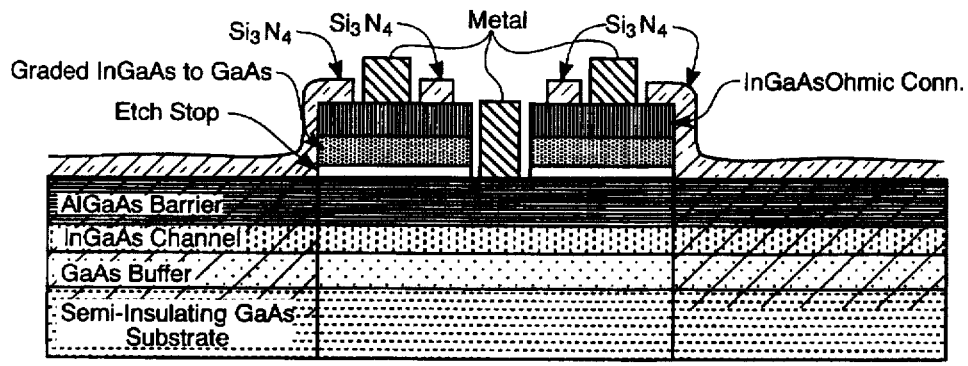
FIG. 2 shows a cross sectional layer view of a pseudomorphic High Electron Mobility transistor (a PHEMT) in accordance with the invention.

FIG. 1 in the drawings shows a cross sectional layer view of one type of field-effect transistor, a High Electron Mobility Transistor (a HEMT) having certain attributes in accordance with the present invention. FIG. 2 in the drawings shows a cross sectional layer view of another type of field-effect transistor, a pseudomorphic High Electron Mobility Transistor (a PHEMT) also having certain attributes in accordance with the present invention. The structural cross section appearance of these two transistors is similar since they differ primarily in the nature of semiconductor material used in the charge carrier-conveying or channel layer of the device. Both of these device types may therefore be structurally represented by a common drawing—as is accomplished in the FIG. 3 series of drawings in which fabrication details of a device according to either of these transistor types are disclosed.

The phrasing "in the FIG. 3 series of drawings" or more simply the term "FIG. 3" is used to refer collectively to the several views of FIG. 3a through FIG. 3m herein. For reasons of drawing practicality little attempt is made to show the layers of the FIG. 1, FIG. 2, and FIG. 3 devices or the transistor structure of the other drawings herein to realistic horizontal or vertical scales. Layer thickness dimensions which range between numeric values of zero and five thousand angstroms for example cannot be realistically represented in a drawing of the FIG. 3 type. Layer thickness dimensions are however shown numerically in the table disclosed below.

As may be appreciated from a close examination of the FIG. 1 and FIG. 2 transistors the present invention is especially concerned with the uppermost several layers of a field-effect transistor. The lower layers of the transistor are largely determined by the type of transistor structure being provided with these upper layers. As may be further implied from this upper layer concern, the present invention may be used with a variety of different underlying field-effect transistor types. The FIG. 1 and FIG. 2 transistors are for example disclosed to be transistors of a particular type, and transistors fabricated with gallium arsenide based materials; the invention is however, believed compatible with several different transistor types and especially with the transistor types which lend to fabrication with other periodic table group III-V materials.

As will become more apparent in the paragraphs following, the present invention is especially concerned with both the metallization portions of the FIG. 1 and FIG. 2 transistors; and with the fabrication steps used to achieve this metallization. In view of this aspect of the invention, transistor devices which are in accordance with the invention have been referred-to by the inventors identified herein and their colleagues by the name of a Single Layer Integrated Metal Field-Effect Transistor i.e., a "SLIMFET". A SLIMFET device according to the invention may therefore combine the underlying structure of several different types of field-effect transistor with the single layer metallization and other details of the present invention.

Figure 3A:
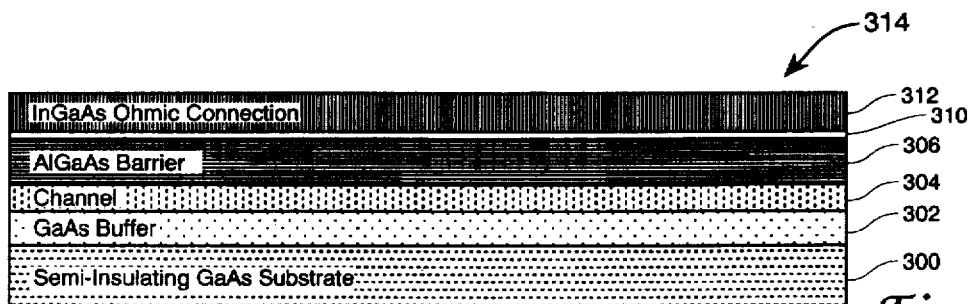
FIG. 3a shows an initial structure usable to achieve the FIG. 2 field-effect transistors.

In the interest of brevity, the present invention is herein disclosed primarily in terms of the FIG. 1 and FIG. 2 devices and their latter stages of fabrication. Mother arrangement of the invention using a different underlying transistor type and omitting certain of the FIG. 1 and FIG. 2 layers is the subject of other of the copending and incorporated by reference patent documents identified above. The FIG. 1 and FIG. 2 fabrication may commence with a multiple semiconductor layer substrate assembly as is shown in FIG. 3a of the drawings. Alternately however, this fabrication may be considered to include the processing steps accomplished on a semiconductor wafer up to the FIG. 3a state. As will become apparent shortly, the FIG. 1 and FIG. 2 drawings are similar to the drawing for the final step of the FIG. 3 fabrication sequence with the exception of the FIG. 1 and FIG. 2 drawings including an additional semiconductor material layer and including more precise identification of the channel layer materials.

Fabrication of a HEMT or PHEMT device according to the present invention may therefore start with a wafer of semi-insulating semiconductor substrate material such as the substrate member 300 in FIG. 3a of the drawings or with a wafer having each of the several layers represented in FIG. 3a already formed or alternately may start with some intermediate status of a wafer such as a wafer having the substrate 300, the buffer layer 302 and the channel layer 304 previously formed, for example. Wafers having all of the layers represented in FIG. 3a may be obtained to specification, e.g., the Table 1 specification below, or as standard products from several suppliers to the integrated circuit art. Suppliers such as Picogiga Corporation and QED Incorporated may be used as a source of such wafers. Wafers having some intermediate number of predisposed layers should also be available from such sources. Selection from these starting point options is therefore primarily a matter of available resources and economic considerations.

In the FIG. 3a view of a wafer segment, a field-effect transistor channel layer 304 is shown to be received on a buffer layer 302 which is supported by a substrate 300. This channel layer is in turn covered by a barrier layer 306, a thin but permanent etch stop layer and ohmic contact layer 312. The layers of the FIG. 3a wafer 314 may be comprised of the materials indicated in the FIG. 3a drawing and may have the thickness, doping levels and other characteristics indicated in Table 1 below.

TABLE 1

| Line No. | Purpose | Material Mole Fraction | Doping Concentration (cm$^{-3}$) | Layer Thickness | FIG. 3a Reference |
|---|---|---|---|---|---|
| 1. | Ohmic Contact | InAs | n-type Si $1 \times 10^{19}$ | 150 Å | 312 |
| 2. | Ohmic Contact | InGaAs X = 0.520 ungraded | n-type Si $5 \times 10^{18}$ | 400 Å | 312 |
| 3. | Ohmic Contact | GaAs | n-type Si $5 \times 10^{18}$ | 15 Å | 312 |
| 4. | Etch Stop | AlAs | n-type Si $5 \times 10^{17}$ | 30 Å | 310 |
| 5. | Barrier Layer | AlGaAs X = 0.24 | n-type Si $5 \times 10^{17}$ | 225 Å | 306 |
| 6. | Delta Doped | | n-type Si $4 \times 10^{12}$ | 0 Å | 306 |
| 7. | Spacer Layer | AlGaAs X = 0.24 | undoped | 40 Å | 306 |
| 8. | FET Channel | InGaAs X = 0.22 | undoped | 125 Å | 304 |
| 9. | Buffer | GaAs | undoped | 4975 Å | 302 |
| 10. | Superlattice Buffer | AlGaAs X = 0.24 | undoped | 30 Å | 302 |
| 11. | Superlattice Buffer | GaAs | undoped | 30 Å | 302 |
| 12. | Buffer | GaAs | undoped | 500 Å | 302 |
| 13. | Substrate | GaAs | semi-insulating | | 300 |

As may be already apparent to persons skilled in the gallium arsenide field-effect transistor art and also apparent from a brief consideration of the several layers represented in the lines of Table 1, certain other routine or standard layers in addition to those shown in FIG. 3 are often used in the fabrication of a HEMT or PHEMT device. These additional layers may include for example the FIG. 1 represented graded layer located intermediate the etch stop layer and the ohmic connection layer. Such a graded layer is helpful in enabling charge carriers to transition from the lightly doped semiconductor material of the barrier layer to the very heavily doped semiconductor material of the ohmic contact layer for example. Since the physical and fabrication nature of this graded layer, and additional other routine or standard layers which may be used in a HEMT or PHEMT device, is dependent on process related considerations i.e., on the equipment and step variations which are commonly used by different suppliers, such routine or standard layers are omitted in the FIG. 3 drawing views. Indeed two such possible fabrication arrangements for another layer of the FIG. 1, FIG. 2 and FIG. 3 devices, the ohmic contact layer 312 appear worthy of mention at this point as an example of alternate fabrications.

The graded ohmic contact layer 312 in FIG. 3a may be fabricated for example using the gas-based analog-like metal organic chemical vapor deposition, MOCVD, process. In such a fabrication arrangement the gas concentrations are continuously varied as the layer is formed so the composition of the layer varies along its top to bottom dimension. The ohmic contact layer 312 may also be formed however, using the more digital-like molecular beam epitaxy or MBE process, (which is implied in Table 1) through the mechanism of forming a series of thin layers of varying composition, i.e., through the formation of a plurality of superlattice layers.

Notwithstanding the expediency of FIG. 3 omitting standard layers, Table 1 above indicates the identity and characteristic of each actual layer including layer gradations which have been found convenient in a starting-point wafer using the processing equipment and expertise available to the present inventors. In Table 1 the layers indicated at line numbers 1, 2, and 3 therefore actually comprise the grading which may be used in forming the ohmic contact layer 312 even though the latter two of these layers is not expressly shown in the FIG. 3 drawings. The FIG. 3 drawings and the descriptions relating thereto in this document may therefore be viewed as showing the essential steps and the essential layers in a present invention fabrication sequence.

In a related manner the recitation of routine or standard layers in the claims of this document is considered to be an undue limitation of the scope of these claims, especially in instances wherein an alternate arrangement transistor—a transistor including alternate routine or standard layer structure, could be asserted to avoid claims reciting different or no standard layers. Several of the claims appended to the present specification therefore also omit routine or standard layer language and are couched in terms of what is deemed to be essential steps and essential layers language.

Before departing from the subject of Table 1 it appears worthy of note that the information in this table represents a specification for fabrication of the FIG. 3a starting point structure using a particular array of processing equipment and expertise. The layers recited in this Table 1 data may be of a single crystal nature. Table 1 by reason of this single crystal and MBE formation foundation does not include certain later occurring additional structure such as primary and secondary masking layers, metallization layers or ion implant isolation regions in its contents; these additions are of course not of MBE origin, nor of a single crystal nature.

Such additional structure is described below in connection with the FIG. 3 sequence of steps.

A close comparison of the thirteen lines or thirteen different steps disclosed in Table 1 with the six layers shown in the FIG. 3 drawings however, suggests another absence of one to one comparison between a Table 1 layer and a FIG. 3 layer, an absence which is in addition to the above noted omission of routine or standard layers from the FIG. 3 drawing; i.e., several Table 1 layers or fabrication steps are involved in the fabrication of certain other FIG. 3 layers. To better illustrate this point, FIG. 4 in the drawings shows a FIG. 3a–like drawing in which each of the layers recited in Table 1 is expressly shown.

Three groups of Table 1 steps, steps commencing with the above explained ohmic contact-related steps (which are numbered lines 1, 2 and 3 in Table 1), are particularly notable in this another absence of one to one layer comparison regard. Second and third groups of multiple steps relating to a single layer therefore also appear in the line number 5, 6 and 7 steps and the line number 9, 10, 11 and 12 steps in Table 1; these steps relate to the barrier layers 306 and to the buffer layer 302 in FIG. 3a respectively. The rightmost column in Table 1 shows a step to FIG. 3 layer relationship for each of the thirteen steps in Table 1.

Although the purpose of each step in Table 1 i.e., the contribution to transistor function which results from each step of this table, will be apparent to those skilled in the transistor fabrication art, the following brief description of these step to function relationships may also be helpful. The etch stop layer of step 4 in Table 1 is for example used to protect the underlying gallium arsenide graded layer from removal or attack during removal of the ohmic contact layer 312. The barrier layer of step 5 is useful to confine charge carriers to the channel layer 304 of the FIG. 3 transistor. The delta doped layer of step 6 in Table 1 is located in the barrier layer and serves to provide carriers in the completed FIG. 3 transistor.

The spacer layer of step 7 in Table 1 serves to reduce carrier scattering by physically separating the channel layer from the carrier supply layer. The channel layer of step 8 in Table 1 is the location of charge carrier flow between source and drain of the FIG. 3 transistor. The buffer layer 302 of FIG. 3 serves as a crystallographic interface between the lattice structure of the substrate member 300 and the differing lattice structure of the channel layer 304. To accomplish this interface however, it is desirable to use a multiple layer fabrication sequence as shown in lines 10–12 of Table 1. The multiple layers of this sequence act as a buffer from the substrate in order to achieve high quality layer growth. The invention uses highly doped InGaAs layers or other low energy bandgap material compatible with the underlying FET layers as the cap layer or ohmic contact layer 312 to form non-alloyed ohmic contacts using known Schottky refractory metallization procedures. The wafer 314 also includes an etch stop layer, represented at 310, in order to control a later-described etch operation.

Figure 3B:
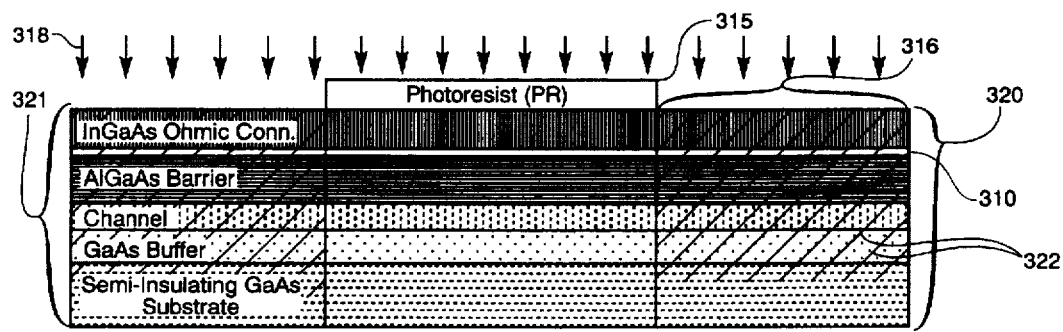
FIG. 3b shows the FIG. 3a structure after an additional processing step.
Figure 3C:
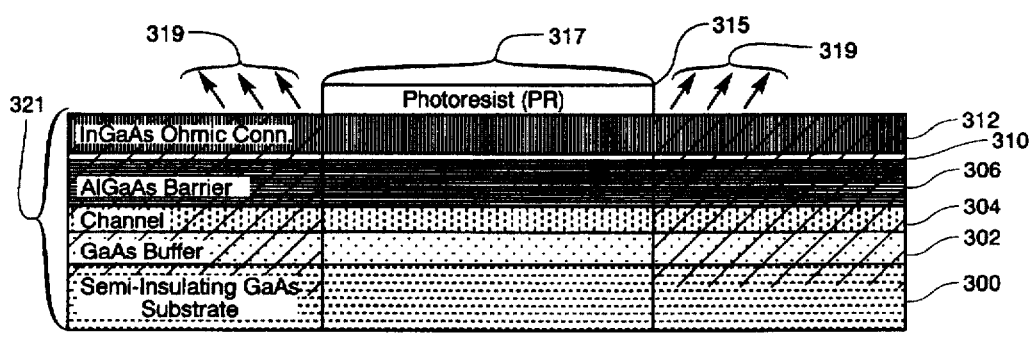
FIG. 3c shows the FIG. 3b structure after an additional processing step.

Continuing with a discussion of the FIG. 3 processing sequence and the other drawings in the FIG. 3 series, an ion implantation-accomplished electrical isolation of adjacent transistors on a wafer, an implantation as represented at 318 in FIG. 3b, may be used to achieve adjacent transistor electrical isolation in the layers below ohmic contact layer 312. Such implanting, with oxygen ions for example, is preferably accomplished through use of the single dual use mask indicated at 315 in FIGS. 3b and 3c—in order to avoid a tedious and error prone mask realignment step. The thusly ion-implanted regions are identified by the shading lines 322 in FIG. 3b and in the subsequent views of FIG. 3. FIG. 3b in the drawings therefore shows addition of the lithographically configured photoresist mask 315 over the ohmic contact layer 312 of FIG. 3a. This dual use mask 315 may be made from one of the photoresist materials PMGI and 1813 made respectively by Micrographic Chemical Corporation (MCC) of Newton, Mass. and by Shipley Corporation of Marlborough, Mass. The multiple-layered isolation regions achieved by such ion implantation are, shown at 320 and 321 in FIG. 3b.

By way of additional explanation, since the InGaAs of the ohmic contact or ohmic connection layer 312, once formed in its heavily doped and electrically conducting condition, is not easily made non-conducting even by this oxygen ion implanting sequence, an actual removal of this ohmic contact layer 312 material in the isolation regions between adjacent transistors of the wafer is desirable. This removal also removes material of the etch stop layer 310 in the non-active areas of the of the device. Several techniques for removing these materials are available. Standard photolithography processes which define the desired transistor active region 317 by way of the mask 315 and enable a selective mesa isolation wet etch in the non active heavily doped regions 316 can for example be used. Such removal of the ohmic contact and etch stop layers 312 and 310 is indicated at 319 in FIG. 3c. The appearance of the ion implanted regions 320 and 321 after removal of implant region portion of the ohmic contact layer 312 and etch stop layer 310 is shown at 324 and 326 in FIG. 3d. The photoresist mask 315 has also been removed in the FIG. 3d drawing.

Figure 3D:
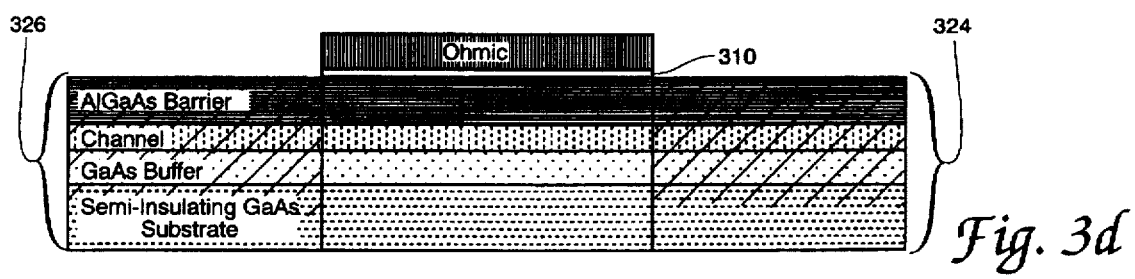
FIG. 3d shows the FIG. 3c structure after an additional processing step.
Figure 3E:
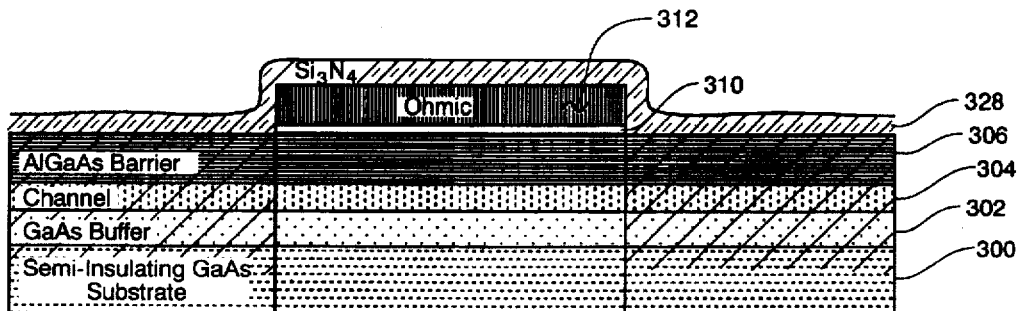
FIG. 3e shows the FIG. 3d structure after an additional processing step.

FIG. 3e shows the deposition of a secondary mask material layer 328 over the FIG. 3d structure. This secondary mask layer is preferably made from silicon nitride or silicon dioxide or other dielectric materials of similar type in the presently described embodiment of the invention-in order to provide the desired non photoresponsive, acceptable permanence and relative temperature immunity characteristics in the layer 328. These are also materials which can be selectively removed from specific areas of the layer 328 without harm to adjacent portions of the transistor in a later portion of the fabrication sequence. Use of another semiconductor material for the secondary mask, a material used in lieu of the silicon nitride or silicon dioxide material identified here, is disclosed in other of the above-identified copending patent documents along with advantages which are thusly achieved. As is suggested by use of this semiconductor material in the secondary mask layer 328, it is not essential that the secondary mask element be composed of dielectric material.

The secondary mask layer 328 serves a combination of significant functions in both the FIG. 3 transistor and in its FIG. 3a–FIG. 3m processing sequence. These functions include:

1. Being a fabrication material for a photographic mask used in a subsequent transistor fabrication step;
2. Being a selectively removable masking material which is non responsive to photoresist mask removal materials;
3. Being a heat resistant electrical insulator on which metallic conducting material can be deposited;
4. Being a permanent covering layer which is not detrimental to performance in the completed transistor;
5. In connection with item 4, since a major part of this secondary mask layer 328 remains in the finished transistor, it provides a desirable degree of passivation and protection of the completed transistor's exposed surface (i.e., in the non-metal covered surface portions) from contamination and physical damage;

6. The layer 328 also can provide the electrical insulation/dielectric material for capacitors of the metal-insulator-metal type used in conjunction with the fabricated field-effect transistor.;

7. Notwithstanding the somewhat overlapping nature of certain of these functions, without the masking capabilities arising from this secondary mask layer 328, and especially the assistance of the resulting mask in precluding another critical mask realignment operation in the transistor fabrication sequence, the benefits of the present invention could not be achieved.

For immediate discussion purposes, the masking-related of these layer 328 functions is of primary interest.

The secondary mask layer 328 may be deposited using a plasma enhanced chemical vapor deposition (PECVD) sequence and is preferably deposited to a thickness of five hundred Angstroms. Parenthetically speaking, the name "secondary mask" for layer 328 is used herein in consideration of one significant function of the layer 328 in the fabrication sequence, i.e., the function of protecting the field-effect transistor ohmic layer during gate window recess etching. Notably the secondary mask layer 328 is omitted from the Table 1 described starting layers of the FIG. 3 transistor since the layer 328 is considered to be part of the "uppermost layers" added in accordance with the present invention rather than part of the "lower" or "starting layers" which may be purchased or fabricated in a separate sequence.

Figure 3F:
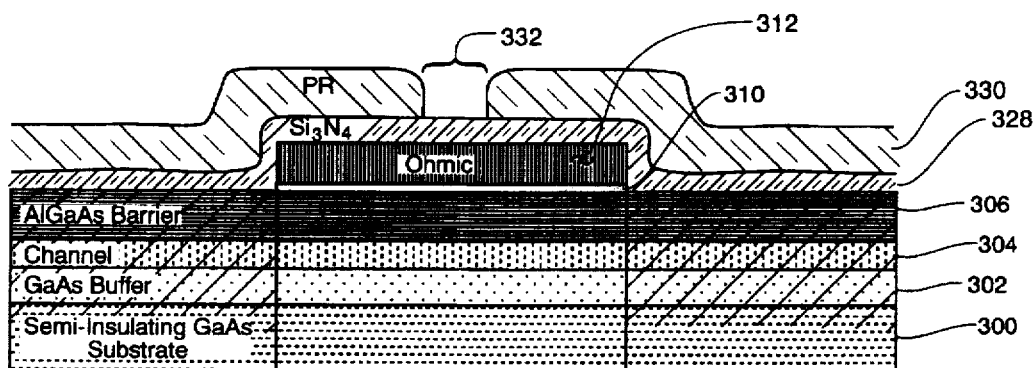
FIG. 3f shows the FIG. 3e structure after an additional processing step.
Figure 3G:
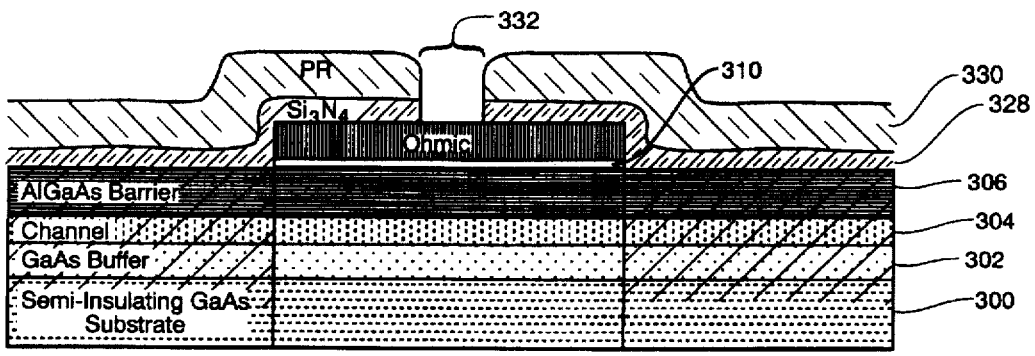
FIG. 3g shows the FIG. 3f structure after an additional processing step.

FIG. 3f of the drawings shows a photoresist layer 330 to be added to the FIG. 3e structure and a gate recess aperture or gate window opening 332 to have been formed photo-lithographically in this photoresist layer. The recess aperture 332 of course provides access to the secondary mask layer 328 in order that it can be removed from the gate window area during a subsequent selective etching. Removal of the secondary mask layer 328 material in the recess aperture 332 to leave the desired gate window recess in the secondary mask layer 328 and enable exposure of the ohmic contact layer 312 material is represented in FIG. 3g. The photoresist layer recess aperture 332 may be composed of the above identified 1813 photoresist material. A buffered oxide etch (BOE) solution is used to remove the secondary mask layer 328 in the aperture 332; this solution may be composed of BOE and water using the volumetric ratio of one to one. The BOE solution may be composed of one part hydrofluoric acid and seven parts ammonium fluoride and may be purchased or locally mixed.

Figure 3H:
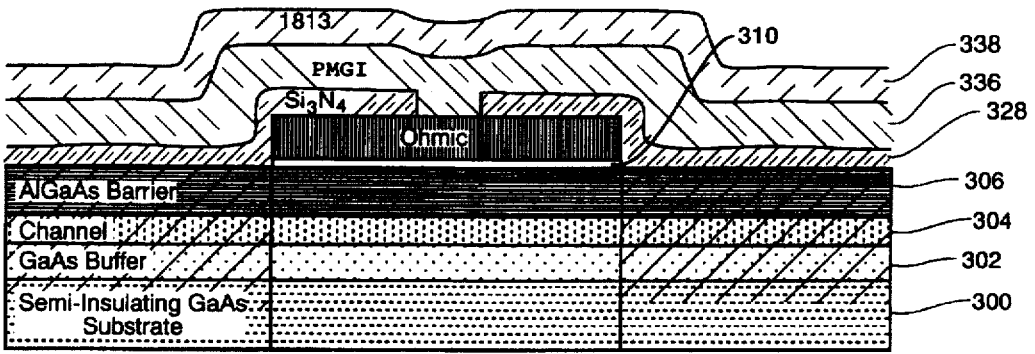
FIG. 3h shows the FIG. 3g structure after an additional processing step.

Next in what may be described as the presently considered "large feature" or "optical lithography" gate region arrangement of the invention the photoresist layer 330 is removed and two new and differing layers 336 and 338 of photoresist are applied to the FIG. 3g structure. The results of this application is represented in FIG. 3h of the drawings. A photoresist material such as the type 1813 is suitable for the upper layer 338 in FIG. 3h. A photoresist material such as the type PGMI resist is suitable for the lower layer 336. The PGMI photoresist layer 336 is of course applied first to the FIG. 3h structure. A "large feature" arrangement of the invention is generally considered here to mean a transistor having a gate region in which the smallest defined feature or the smallest desired dimension is of at least six tenths of a micron in dimensional size. An electron beam exposure-based accomplishment of the invention for gate region dimensions smaller than this six tenths of a micron is described below herein and is considered to represent an alternate arrangement of the invention.

Figure 3I:
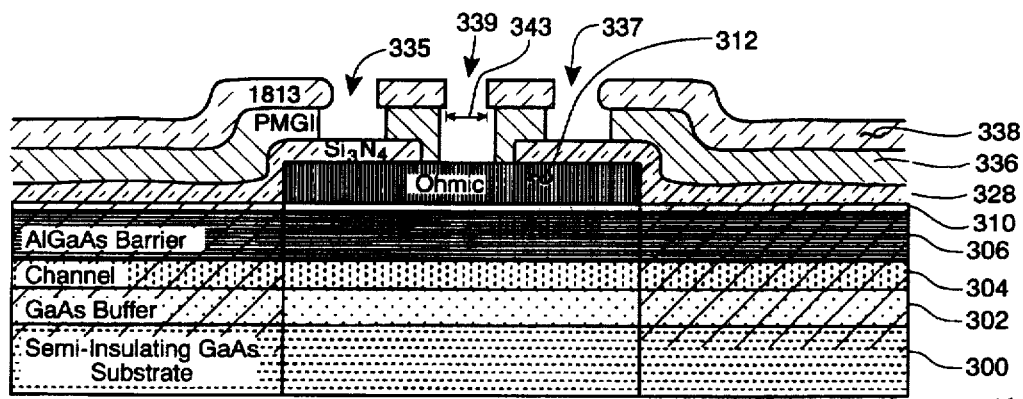
FIG. 3j shows the FIG. 3i structure after an additional processing step.
FIG. 3k shows the FIG. 3j structure after an additional processing step.
FIG. 3l shows the FIG. 3k structure after an additional processing step.
FIG. 3m shows the FIG. 3l structure after an additional processing step.
Figure 3J:
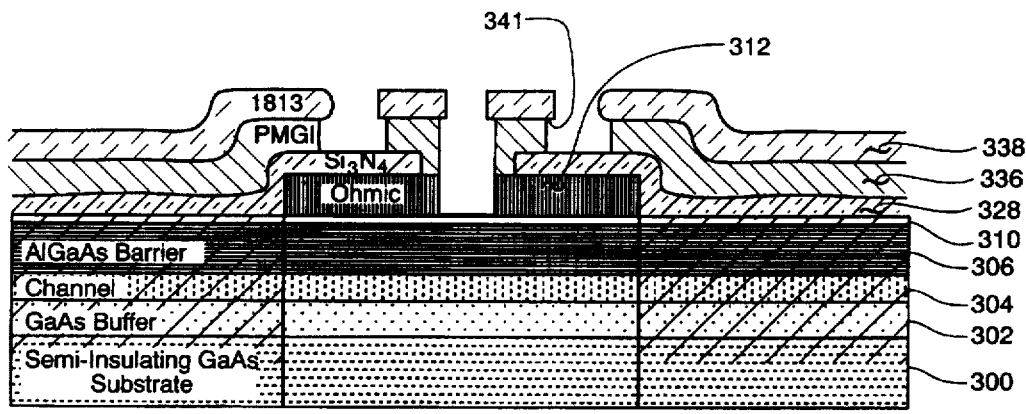

The formation of photolithographically defined source contact and drain contact apertures 335 and 337 (respectively for example) in the photoresist layers 336 and 338 is indicated in FIG. 3i and FIG. 3j of the drawings. In addition to these source contact and drain contact areas, these steps may also identify or form interconnect metal-receiving areas on the secondary mask layer 328 of the transistor. The FIG. 3j step also represents the definition, within the aperture 339, of gate geometry, i.e., the gate length and gate width dimensions of the transistor as will be apparent in the forthcoming discussion. (Gate "length" here is presumed, according to convention, to extend in the direction of charge carrier flow or from left to right or right to left in FIG. 3j.) Source and drain elements in a field-effect transistor are of course often electrically interchangeable hence the use of non-specific references to these elements in the language herein.

Notably the gate geometry definition in the FIG. 3j step is accomplished on the ohmic contact layer 312 while the source and drain definitions occur on the secondary mask layer 328. It is also notable that the developing and removal of mask aperture areas represented in FIG. 3j have additionally been used to accomplish the upper mask lip or overhang or cliff region 341 in FIG. 3j. This overhang region assures the presence of metal breaks which are useful in separating desired gate, source and drain contact metal from undesired excess metal inherently deposited on the upper surface of the photoresist layer 338 during a later metal removal step of the fabrication process. As is known in the lithography art, an over development of the image in the photoresist layer 336 may be used to achieve the lip or overhang or cliff region 341. A somewhat parallel but alternately worded description relevant to certain preceding and ensuing portions of the FIG. 3, process is disclosed in connection with FIG. 5e and other FIG. 5 views in a later part of this document. This description, though inclusive of certain understandable differences with respect to FIG. 3, may nevertheless be helpful, through repetition and edited text, in reaching a complete understanding of the FIG. 3 processing steps.

In the FIG. 3j drawing, use of a selective etch step to remove a gate window sized aperture in the ohmic contact layer 312 is represented. Complete removal of the ohmic contact layer 312 down to the etch stop layer 310 is desired since the subsequently received gate metal should ultimately be formed on the barrier layer 306 underlying the ohmic contact layer 312. This selective etch for the indicated indium gallium arsenide material of this layer 312 may be accomplished using the citric acid/hydrogen peroxide etch process described in the four published papers of G. C. DeSalvo et al., G. C. DeSalvo et al., R. D. Remba et al. and J. K. Abrokwah et al. A timed selective etch is preferred for the aperture 339 ohmic material removal step indicated in FIG. 3j; both wet and dry etching is possible, however, an etchant specifically composed of citric acid and hydrogen peroxide is preferred for gallium arsenide embodiments of the invention.

The four published papers of G. C. DeSalvo et al., G. C. DeSalvo et al., R. D. Remba et al. and J. K. Abrokwah et al. are identified as follows and are hereby incorporated by reference herein.

Etch Rates and Selectivities of Citric Acid/Hydrogen Peroxide on GaAs, $Al_{0.3}Ga_{0.7}As$, $In_{0.2}Ga_{0.8}As$, $In_{0.53}Ga_{0.47}As$, $In_{0.52}Al_{0.48}As$, authored by G. C. DeSalvo et al., and appearing at page 831 in the J. Electrochem. Soc., Volume 9, Number 3, March 1992.

Citric Acid Etching of $GaAs_{1-x}Sb_x$, $Al_{0.5}Ga_{0.5}Sb$, and InAs for Heterostructure Device Fabrication, authored by G. C.

DeSalvo et al., and appearing at page 3526 in the J. Electrochem. Soc., Volume 141, Number 12, December 1994.

Making a High-Yield, 0.33 Micron, MBE-Based GaAs MMIC Production Process, authored by R. D. Remba et al, and appearing at page 90 in the conference proceedings of the 1994 U.S. Conference on GaAs Manufacturing Technology (MANTECH), May 1994.

High-Performance Self-Aligned p+/n GaAs Epitaxial JFET's Incorporating AlGaAs Etch-Stop Layer, authored by J. K. Abrokwah etal., and appearing at page 1529 in the IEEE Transactions on Electron Devices, Volume 37, Number 6, June 1990.

It is notable that the selective etch of FIG. 3j stops at the etch stop layer 310. This etch stop layer 310 is of course included in the FIG. 3 structure expressly for the purpose of accomplishing the FIG. 3j etch stop and protecting the underlying barrier layer from etch degradation. By way of this layer 310, the FIG. 3j etch is also made to be of a non time critical nature since the indicated aluminum arsenide material of the etch stop layer 310 is substantially unresponsive to the citric acid/hydrogen peroxide etch process. Since the etch rates of the Indium Gallium Arsenide ohmic contact layer 312 is substantially faster than that of the Aluminum Gallium Arsenide barrier layer 306 it is also possible to use these different etch rates to an advantage and avoid use of the etch stop layer 310 altogether. This absence of the etch stop layer 310 is in fact considered to be a viable alternate arrangement of the invention. In any event it is particularly notable that the source and drain regions of the FIG. 3 transistor, the regions at 335 and 337 remain protected by the secondary mask layer 328 during this FIG. 3j timed selective etch step.

This protective function suggests, as indicated above, reference to the layer 328 as a secondary mask layer. Identification of this protective function also enables a better understanding of the importance of the secondary mask layer 328 in achieving a transistor according to the present invention. Without the separate but jointly present in FIG. 3i and FIG. 3j masks for the regions at 335/337 and 339, a delicate mask realignment step and separate distinct metallization operations for these regions would be required-as is believed to be the present state of the field-effect transistor fabrication art (underline added for emphasis). (It is particularly notable, for example, that the process of the above identified U.S. Pat. No. 4,961,194 of S. Kuroda et al, does not include the mask of layer 328 and does contemplate separate metallization steps). In addition to enabling a single common metallization step, the absence of a realignment step is particularly desirable in the gate region of a field-effect transistor since accurate gate placement is needed to obtain the intended performance from a fabricated device and since the desired dimensions, especially as recited in the "small gate" description below, can be quite small. It is also notable that the FIG. 3j etch step represents a selective removal of the Indium Gallium Arsenide or the graded layers comprising the ohmic contact layer 312 from the gate region through the expediency of having included the secondary mask layer 328 in the FIG. 3 device and without use of a two step lithographic process.

Figure 3K:
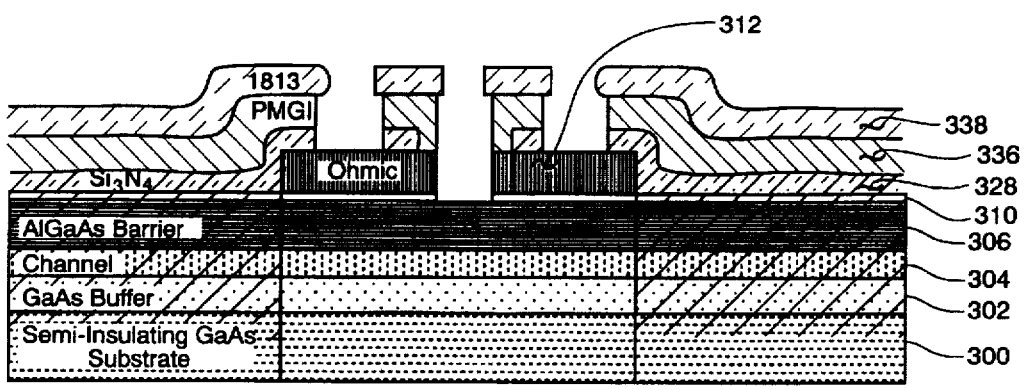

FIG. 3k represents accomplishment of a wet chemical etching of the secondary mask layer 328 to expose the ohmic contact layer 312 material of the source and drain regions in the transistor. Notably this some wet chemical etch also serves to remove the etch stop layer 310 in the aperture 339 (underline again added for emphasis). A buffered oxide etchant solution is used for the FIG. 3k joint source/drain and gate etches. An etch solution composed of BOE and water with a ratio of one to one and available from Ashland Chemical Corporation may be used for this purpose.

With the source/drain and gate regions of the FIG. 3k device exposed a single deposition of metal as represented at 340 in FIG. 3l can be accomplished. A metal scheme which includes Titanium Platinum and Gold with the thicknesses of 200:500:5300 Angstroms respectively is usable for this purpose. Other metal combinations including palladium, germanlure, nickel, chromium and tungsten may also be used in this step. It is significant to note that the gate length dimension is determined during the FIG. 3l metal deposition by the size of the 1813 photoresist material mask opening, i.e., by the dimension 343 in FIG. 3i.

By using small bandgap InGaAs as a source/drain ohmic contact epitaxial layer, and high bandgap AlGaAs for the gate contact semiconductor-layer, alloying of the deposited metal 340 at the source and drain contact areas is not required. Thus, a standard Schottky gate metallization scheme such as Ti/Pt/Au can be used to form the Schottky gate without appreciably raising the achieved ohmic contact resistance. Therefore by way of the differing semiconductor materials and doping concentrations present in the source/drain and gate regions of the device, i.e., present below the FIG. 3m metallizations, the desired ohmic contact electrical characteristics are obtained at the source/drain contact regions and a Schottky barrier electrical characteristic is obtained at the gate contact region with a single metallization step. (Underlining again added for emphasis.) Since the FIG. 3i photoresist pattern is used both as the gate recess etch mask in FIG. 3j and as the gate metal definition mask in the FIG. 3l step, the gate metal is self-aligned to the etched gate recess region on the transistor channel—as is also desired for achieving the optimum gate positioning which enables best transistor performance and yield.

The FIG. 3l metallization step also deposits metal over the top surface of the FIG. 3k structure, (i.e., over the photoresist layer 338), and thereby such metallization has potential to be used to form the transistor gate feed and pad regions and the interconnecting conductors of the transistor. For such interconnecting conductor formation however it is necessary to have previously removed the photoresist layers 336 and 338 at the desired interconnect regions since a metal lift-off step is preferably used subsequently to remove any metal supported only by photoresist mask material of these layers.

Figure 3M:
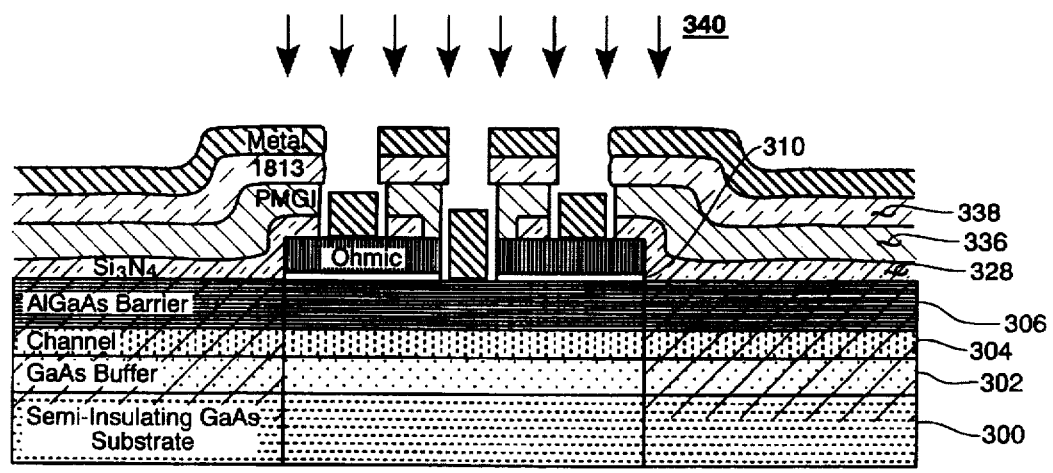
Figure 3M:
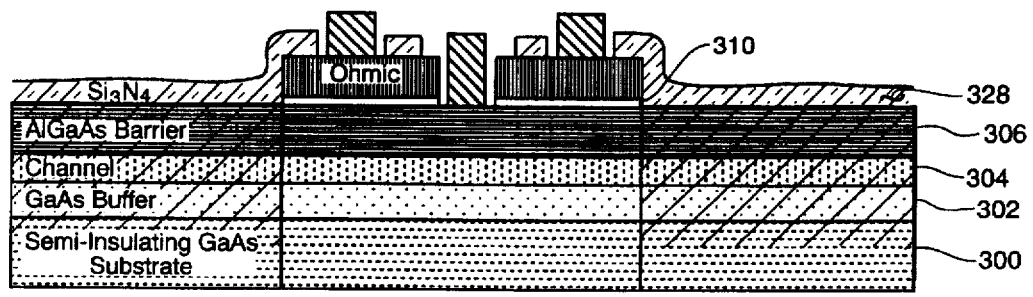

Removal of the photoresist layers 336 and 338 is represented in the FIG. 3m drawing. This removal accomplishes a lift-off separation of undesired metal from desired metal by way of the lip or overhang or cliff region 341 areas described previously. The device achieved after this metal lift-off includes the alluded to non-alloyed contacts in the source/drain and gate regions of the transistor. These non-alloyed contacts are again a result of the highly doped semiconductor material underlying the metal contacts. Following such metal lift-off the FIG. 3 device is complete and ready for use of known device incorporation procedures.

Figure 6:
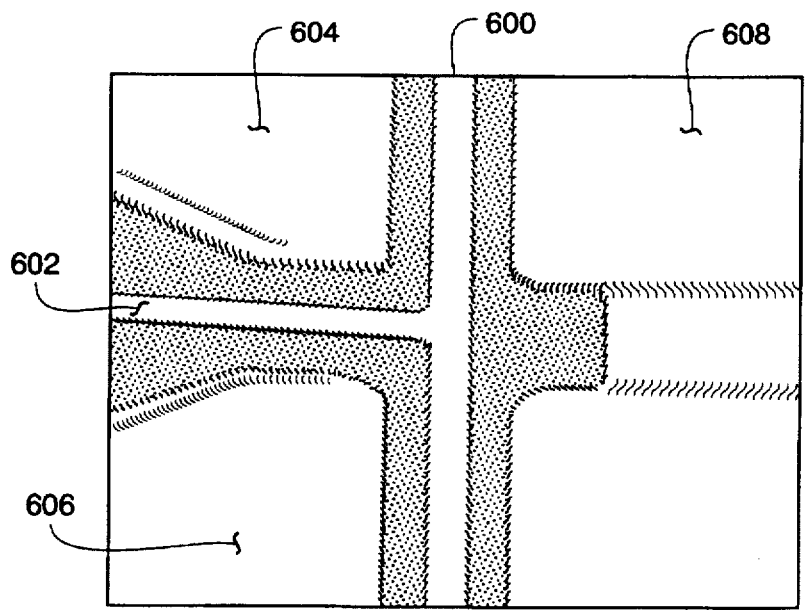
FIG. 6 shows a drawing representation of a top view microphotograph of a transistor according to the invention.

FIG. 6 in the drawings shows a scanning electron microscope view of a field-effect transistor device according this process. In FIG. 6 a center-tapped, center fed gate contact appears at 600, the gate feed conductor at 602, portions of the source contact for example at 604 and 606 and a drain contact at 608. The FIG. 6 drawing is a drafting rendition of an actual scanning electron microscope microphotograph.

SMALL GATE GEOMETRY, ELECTRON BEAM OPTICAL LITHOGRAPHY PROCESSING

The fabrication sequence described thus far in this document has been based on use of optical exposures during lithography for all elements of the transistor, elements which significantly include the important gate contact and determination of its positional location within the source to drain space of the transistor. It is known in the device fabrication art however, that even ultraviolet light-based optical lithographic techniques as contemplated thus far herein are limited to feature sizes of about six-tenths of a micron and larger since the wavelength of the optical energy employed in the lithography becomes a dimension-limiting factor. Electron beam-based lithography with its higher energy levels and therefore smaller wavelengths offers one alternative to this resolution limitation and enables achievement of the sometimes desired smaller features. This relief however, comes at the expense of device processing throughput speed since point by point beam scanning over the transistor features being defined is required in electron beam lithography and only limited scanning speeds are practical to achieve the needed photoresist exposures.

The combined use of electron beam-based lithography for small feature definitions, in a transistor gate region for example, together with optical or ultraviolet exposures for larger device features has been described in the two technical papers "Single-Cycle Lithography Process for Both Large and Sub-Half-Micron Features", J. S. Sewell et al.; SPIE vol 1671, (1992) page 177, and "A Combined Electron Beam/Optical Lithography Process Step for the Fabrication of Sub-Half-Micron-Gate-Length MMIC Chips", J. S. Sewell and C. A. Bozada NASA Conference Publication 3249, volume 1, page 54, (1993); papers which originate in the same United States Air Force laboratory as the present invention. An early predecessor of the J. S. Sewell et al. process is also described in the paper of Y. Todokoro et al. "A Hybrid E-beam/Deep-UV Lithography for GaAs FET's", SPIE Electron-Beam, X-Ray and Ion-Beam Lithographies VI, Vol. 773, Pages 54–60, 1987. Each of these technical papers is also hereby incorporated by reference herein.

Figure 5A:
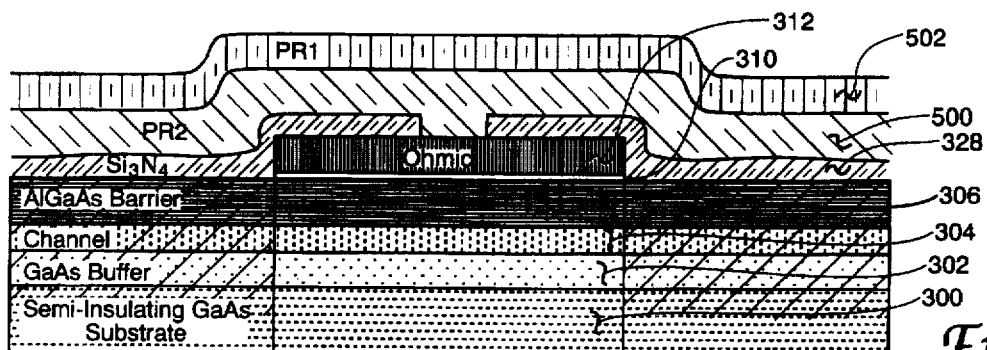
FIG. 5a shows an initial step in a small geometry alternate fabrication sequence for a FIG. 2 PHEMT field-effect transistor.

The electron beam inclusive process disclosed in these papers has been identified by the name of the Electron Beam Optical Lithography process, the "EBOL" process, by the authors and present users. This process diverges from the FIG. 3—described transistor processing sequence immediately prior to the FIG. 3h step. In other words, the earlier FIG. 3 steps, as shown in FIG. 3a through FIG. 3g, are accomplished on the transistor and then the processing described in the FIG. 5 drawings is employed. This FIG. 5 sequence commences with deposition of differing photoresist layers as is shown in FIG. 5a of the FIG. 5 drawings. This FIG. 5 process, EBOL process, uses optical photolithography for features greater than 0.6 micron in size, deep ultraviolet (UV) lithography for features between 0.6 micron and 0.4 micron, and the slower but more accurate and high resolution electron beam lithography for features between 0.4 micron and 0.05 micron. The EBOL process therefore combines optical photolithography and electron beam lithography into an optimized single optical/electron beam lithographic process step.

Three different types of photoresist material formed into four distinct layers are used in the FIG. 5a step. Three of these different types of photoresist are used in the electron beam exposure sequence and consist of related material types and are therefore shown as a single layer, the layer 500, in FIG. 5a. The fourth photoresist layer is used for the optical portion of the EBOL process and is represented as the layer 502 in FIG. 5a. This somewhat elaborate procedure provides one arrangement for fabricating the mushroom gate structure of low parasitic inductance and gate resistance that is desirable in many transistors made in accordance with the invention. Other photoresist arrangements for forming a mushroom gate structure including arrangements requiring fewer layers of photoresist material are believed available from other fabricators, however the arrangement disclosed herein has been found compatible with the apparatus available to the present inventors and to provide satisfactory transistors. The low electrical inductance and low gate resistance characteristics of a mushroom gate structure are particularly desirable in transistors intended for use in microwave, millimeter wave and other high frequency applications. The photoresist layer shown at 500 in FIG. 5a consists of a bottom-most film of PMMA (polymethylmethacrylate) photoresist material, an intermediate film of copolymer photoresist material and a third layer of additional PMMA photoresist material. A major consideration in the use of these three layers involves the need for photoresist materials of differing exposure sensitivity in order to define the mushroom gate structure using a dosing modulation arrangement. Another consideration involves accomplishment of the FIG. 5 embodiment of the above described metal lift-off-enabling lip or overhang or cliff region 341 in the upper photoresist layer. Additional explanation of this procedure is provided below. The fourth photoresist layer of the FIG. 5a device is the illustrated layer 502 and is composed of type 1400-27 photoresist. The PMMA photoresist material is available from Microlithography Chemical Corporation, MCC, of Newton, Mass.; the copolymer photoresist material is available as a type p(MMA-MAA) photoresist from MCC; the type 1400-27 photoresist was formerly available from Shipley and is believed now available from other suppliers known in the integrated circuit art.

After the FIG. 5a photoresist layers are in place, optical lithography exposures, performed with an optical aligner apparatus, are used to define source/drain, gate feed, optical pad and interconnect regions in the photoresist layers 500 and 502. The source and drain portions of this definition are indicated at 504 and 506 in FIG. 5b of the drawings where the optically exposed regions appear shaded. These large feature portions of the FIG. 5 transistor are defined optically in order that their exposure is accomplished "in parallel" and thereby as rapidly as possible. The FIG. 5b optical lithography exposure of the layers 500 and 502 each for the source and drain contacts (underline again added for emphasis) are accomplished at two different times (i.e., a different time for each layer) and involve two different ultraviolet wavelengths as is described below. Electron beam exposure of the same layer 502 for gate contact formation occurs subsequently.

Figure 5B:
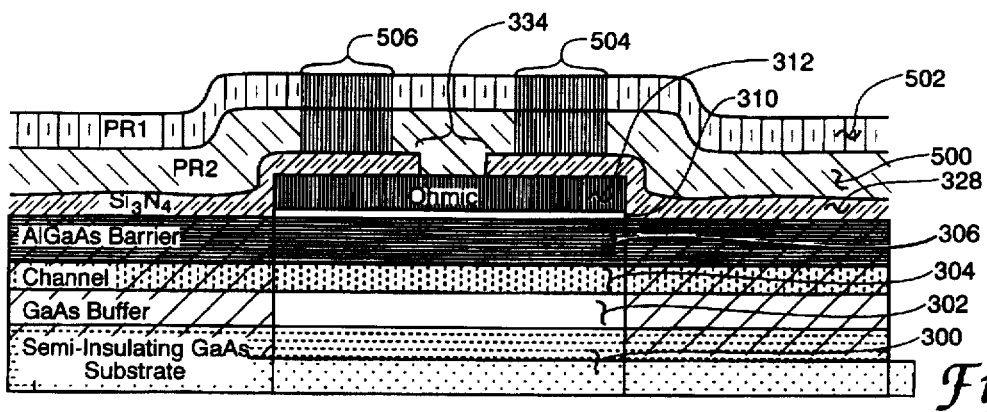
FIG. 5b shows the FIG. 5a structure after an additional processing step.
Figure 5C:
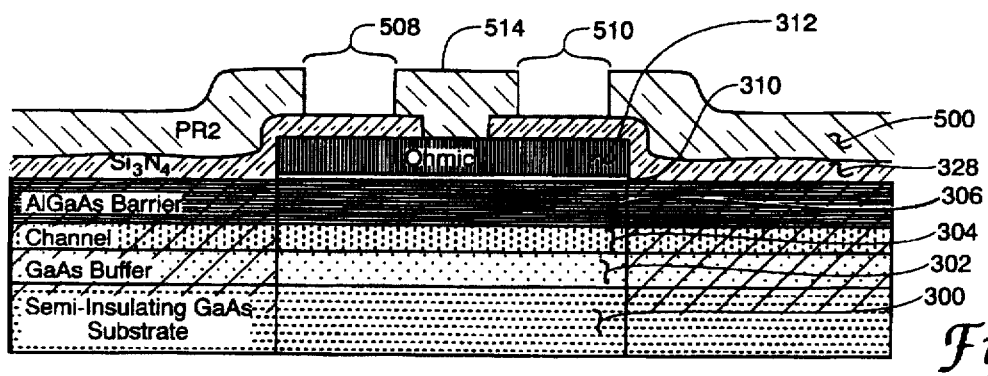
FIG. 5c shows the FIG. 5b structure after an additional processing step.

The FIG. 5b exposure commences with a longer ultraviolet wavelength exposure of the uppermost layer 502 in the source and drain regions 504 and 506 followed by development removal of the exposed photoresist material. The type 1400-27 photoresist material of layer 502 is responsive to a longer ultraviolet light wavelength of 405 nanometers. After development of the layer 502 exposed regions, the resulting apertures at 504 and 506 are then used as masks for defining a short wavelength ultraviolet exposure of the underlying layer 500, again in the regions 504 and 506. The electron beam responsive PMMA photoresist material of layer 500 (i.e., the three films of the layer 500) is, in addition to its electron beam response, also responsive to an ultraviolet light wavelength of 265 nanometers, a shorter ultraviolet wavelength used for this exposure.

Following this two wavelength ultraviolet light exposure sequence a double removal step is performed. In this double removal the remaining upper photoresist layer 502 is removed and simultaneously the exposed PMMA photoresist films of the layer 500 are etched away. The results of this double removal appear in FIG. 5c of the drawings where the source and drain apertures 508 and 510 are shown to extend down to the secondary mask layer 328. This double removal step is performed with a photoresist solvent material, preferably acetone. The layer 502 photoresist material is not affected by this acetone removal because of the occurrence of low dissolution rates on exposed electron beam resist. Although this double removal action is convenient and provides satisfactory results in the present sequence it is possible that an uncoupling of the two actions it accomplishes may be desirable in some circumstances. Both the photoresist materials and the photoresist reactant materials to permit this uncoupling are believed to be now (or shortly in the future)available from suppliers to the integrated circuit art such as MCC or Shipley. Either the coupled or uncoupled arrangement of this removal is therefore considered to be within the spirit of the invention.

Figure 5D:
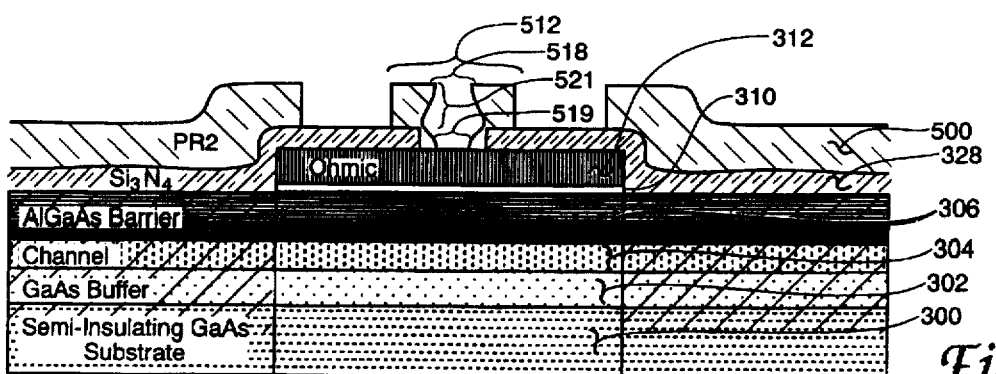
FIG. 5d shows the FIG. 5c structure after an additional processing step.

The FIG. 5d step represents the definition of gate geometry, i.e., the gate length and gate width dimensions of the FIG. 5 transistor. (Gate "length" here is again presumed, according to convention, to extend in the direction of charge carrier flow, e.g., from left to right in FIG. 5d.) In the desired high resolution electron beam gate definition procedure this gate contact geometry, including its FIG. 5d cross sectional shape, is defined by the manner in which an electron beam is scanned over the photoresist mask area 514 in FIG. 5c. A scanning pattern which will achieve the "top-heavy" mushroom-like gate cross-section described above is desired.

A number of different scanning patterns can be used to achieve the depicted small footprint and larger top-most portions of low electrical resistance and low electrical inductance mushroom-like gate contact shape. In the presently preferred of these scanning patterns the electron beam is moved linearly to define the lowermost FIG. 5d regions 519 of the gate aperture, to expose lowermost parts of the photoresist mask area 514 in the gate window 334, and moved over a selected two dimensional pattern in the "tophat" or "sidelobe" areas 521 of the gate contact. Such a pattern is effective in achieving a shape of the type illustrated in FIG. 5d. A connected series of small rectangle shapes is found to be satisfactory for this "tophat" or "sidelobe" areas electron beam exposure.

The development used in this instance involves a Methyl Iso-Butyl Keytone and Isopropyl Alcohol, MIBK:IPA, developer mixture or may use a chlorobenzene developer. This developer is active on the P(MMA-MAA) film however, it provides slower development of the top-most and bottom-most PMMA in photoresist layers 500. The photoresist layer 502 has been stripped away prior to the MIBK:IPA develop. The appearance of the gate contact mask after development of the exposed electron beam photoresist material and uncovering of the ohmic contact layer 312 in the gate contact mask window 518 is represented in the FIG. 5d drawing.

The resolution and precisely controlled nature of this FIG. 5d electron beam exposure sequence allows placement of the gate contact in the center of the gate window 334 or alternately allows precise placement closer to either source or drain contact as is desired in some transistor devices. It may be appreciated therefore that a plurality of factors have been combined in defining the desired gate contact shape in this EBOL related sequence. These factors include a combination of sensitivity difference between the films of the photoresist layer 500, the dosing modulation achieved with a linear and connected series of small rectangles electron beam scanning pattern, the differing development responses of the PMMA and P(MMA-MAA) in the layer 500 and differing developer sensitivities and energy profiles.

Figure 5E:
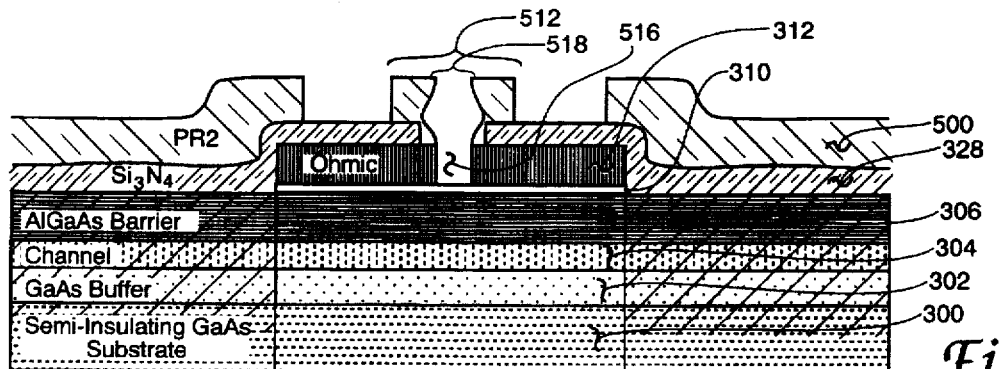
FIG. 5e shows the FIG. 5d structure after an additional processing step.

In the FIG. 5e drawing the results of using a selective etch step to remove a gate sized aperture 516 in the ohmic contact layer 312 is represented. Complete removal of the ohmic contact layer 312 down to the etch stop layer 310 is desired since the subsequently received gate metal is to be formed on the barrier layer underlying the ohmic contact layer 312. Selective etch of the indicated indium gallium arsenide material of this layer ohmic contact layer 312 may be accomplished using the citric acid/hydrogen peroxide etch process described above; a precise end point for this etch is established by the etch stop layer 310. It is notable that the source and drain regions of the FIG. 5 transistor, the regions at 508 and 510, remain protected by the secondary mask layer 328 during this FIG. 5e selective etch step.

Figure 5F:
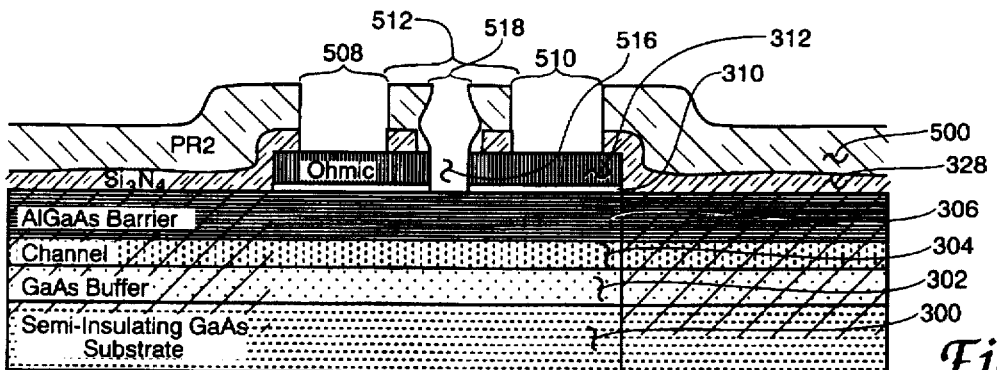
FIG. 5f shows the FIG. 5e structure after an additional processing step.

FIG. 5f represents accomplishment of a wet chemical etching of the secondary mask layer 328 in the source and drain regions 508 and 510—to remove the silicon nitride of this secondary mask layer 328 and expose the ohmic contact layer 312 material of the source and drain regions in the transistor. Notably this same wet chemical etch also serves to remove the etch stop layer 310 in the window 518 to form the gate contact recess aperture 516. A buffered oxide etchant solution is used for the FIG. 5f joint source/drain and gate etches etch solution composed of BOE and de-ionized water which is available from Ashland Chemical Corporation may be combined with water in a concentration between one to fifty and one to two hundred and used for this purpose. Notably this FIG. 5f etch step represents a selective removal of the Indium Gallium Arsenide or the graded layers comprising the ohmic contact layer 3 12 from the gate region through the expediency of having included the secondary mask layer 328 in the FIG. 5 device and without use of a two step lithographic process.

Figure 5G:
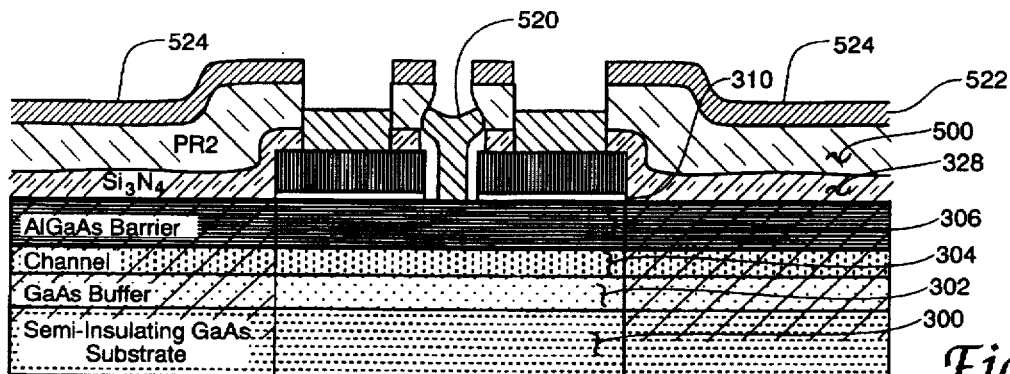
FIG. 5g shows the FIG. 5f structure after an additional processing step.

With the source/drain and gate regions of the FIG. 5f device exposed, a single deposition of metal as represented at 522 in FIG. 5g can be accomplished. A metal scheme of Titanium Platinum and Gold in the respective thicknesses of 200:500:5300 is again found desirable for this purpose. Other metal combinations including Titanium and Gold in the thickness range of 6000 Angstroms and the combination of nickel and gold may also be used in this step. Any metal that forms both a Schottky contact to the gallium arsenide, or other selected group III–V gate region semiconductor material, and an ohmic contact to highly doped ohmic layer version of this semiconductor material and can be deposited by evaporation can be used in the metallization step-so long as the metal also does not degrade the underlying photoresist during deposition. This metallization step therefore also forms the gate contact 520 in FIG. 5g and also deposits metal at 524 over the top surface of the FIG. 5f structure as shown in FIG. 5g, i.e., over the photoresist layer 500.

This metallization step thereby may be used to form the interconnecting conductors of the transistor including the gate feed and pad regions. For such interconnecting conductor formation it is necessary to have previously removed the photoresist layer 500 at the desired interconnect regions since a metal lift-off-step is again used subsequently to remove any metal supported only by such photoresist mask material. Since the same photoresist pattern is used both as the gate recess etch mask and as the present gate metal definition mask, the gate metal of the FIG. 5g step will be self-aligned to the etched gate recess region on the FET channel.

Figure 5H:
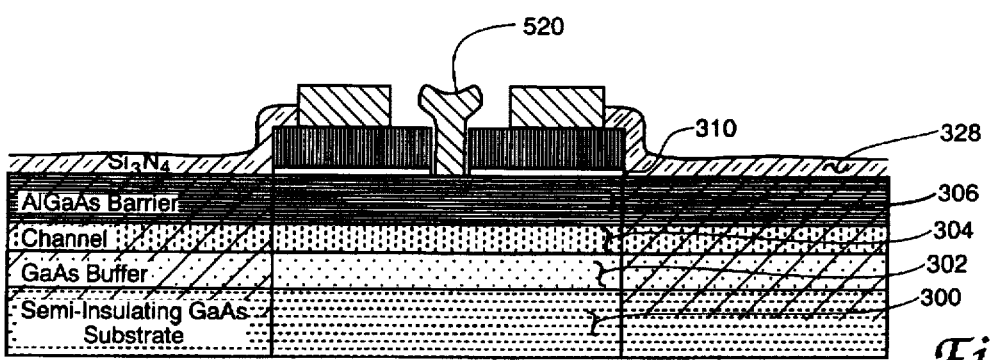
FIG. 5h shows the FIG. 5g structure after an additional processing step.

Removal of the photoresist layer 500 is represented in the FIG. 5h drawing. This removal accomplishes a metal lift-off separation of undesired metal from desired metal by way of lip or overhang or cliff region 341 areas described previously in connection with FIG. 3. The device achieved after this metal lift-off includes non-alloyed contacts in the source/drain and gate regions. Following such metal lift-off the FIG. 5 device is complete and ready for known device incorporation procedures.

While the above description of the EBOL process is believed sufficiently complete to enable its understanding and accomplishment by persons of skill in the semiconductor device art, the following additional descriptive material which appears in the above referenced article of J. S. Sewell et al., may be of assistance in facilitating this understanding and accomplishment. This material is in the form of a two paragraph description of the EBOL process followed by recitation of the seven steps used in fabricating a 0.25 micrometer mushroom gate field-effect transistor device by this process.

The EBOL process is as follows. The wafer is coated with standard e-beam resist scheme (1 to 3 layers), followed by a layer of optical photoresist. The wafer is then aligned and exposed to the gate pad mask using an optical mask aligner. The top photoresist is then developed. The resulting pattern is used as a mask for a deep UV exposure of the e-beam resists. The large patterns are now exposed. The top layer photoresist is then removed without damaging the underlying e-beam resists. Next, the gates are written by e-beam. Once the exposed resists are developed, metal is deposited. The resulting metal layer consists of very large gate pads and 0.25 μm gate fingers. The turn-around time is very fast compared to our standard 2-cycle process, and no step coverage problem exists of the gate fingers onto the gate pads.

The major obstacle in developing this process was to remove the top-layer photoresist after the deep UV exposure without affecting the underlying e-beam resists. It was first believed the optical photoresist could be developed out after the deep UV exposure flit was flood exposed by light. Poly(methyl methacrylate) (PMMA)[2] was used for the initial process development. The optical photoresist used was 1400–273. When 351 developer[4] was used to remove the exposed 1400–27, a thin film formed between the PMMA and the 1400–27 resists which could not be removed by realistic methods (i.e. solvent clean, microposit remover 1165[5], or oxygen plasma stripper). SAL 110-PLI[6] (PMGI) was tried in place of PMMA and a similar film formed. After unsuccessful attempts to try to develop the photoresist away, dissolving it was tried. PMGI can be dissolved by 1165, PMMA by 1165 or by acetone, and 1400–27 by acetone. Fortunately, the dissolution rate of PMMA in acetone is much slower than 1400–27 in acetone. A short blast of acetone was shown to remove the 1400–27 without significantly affecting PMMA or PMGI resists. After the photoresist was removed the e-beam write, development, gate recess etch, gate deposition and lift-off were routine."

The text adjacent the superscripted numbers 4, 5, and 6 in these paragraphs refer to product name designations of the Shipley Company Incorporated of 455 Forest Street, Marlborough, Mass., 01752.

The seven step 0.25 micrometer gate example of an EBOL fabricated device is as follows. Drawings representing device appearances in connection with each step appear in the Sewell et al., paper.

1. Solvent clean.
    Spin e-beam resist—PMMA 496 K 4% (60 seconds at 3000 rpm), P(MMA-MAA) Type 19% (60 seconds at 3000 rpm), PMMA 496 K 4%; chlorobenzene (2:1) (60 seconds at 3000 rpm).
    Bake—5 minutes on a 200° C. hot plate.
    Spin optical photoresist—1400–27 (30 seconds at 4000 rpm).
    Bake—5 minutes on a 100° C. hot plate.
2. Align and expose optical resist using gate pad/interconnect mask—12 mw/cm$^2$ for 42 seconds.
    Develop 1400–27 photoresist—351: de-ionized water (1:5) (30 seconds at 500 rpm), de-ionized water (30 seconds at 500 rpm).
    Deep-UV exposure—240 nm at 10 mw/cm$^2$ for 600 seconds.
3. 1400–27 removal—acetone spray (15 seconds at 500 rpm), isopropyl alcohol (15 seconds at 500 rpm).
4. E-beam direct write—JEOL JBXSDII(U), 5th lens, 50 kV, 50 pA, (A, 10), center single-pass-lines (dose: 3.5 nC/μm), 0.1/μm offset wing areas (0.25 μm wide) (dose: 150 μC/μm$^2$).
5. Develop e-beam resists—chlorobenzene 15 seconds at 500 rpm), isopropyl alcohol (30 seconds at 500 rpm), Methyl-isobutyl-ketone (MIBK): isopropyl alcohol (1:1) (90 seconds at 500 rpm), isopropyl alcohol (30 seconds at 500 rpm).
6. Oxygen plasma.
    Gates recess—standard.
    Pre-metal dip—standard.
    Gate metal deposition—approximately 7500 Å (standard gate metal).
7. Gate metal lift-off.
    Solvent clean.

SUMMARY

The cooperation achieved between the primary and secondary mask sets in each of the above described fabrications of the present invention is believed worthy of added discussion and emphasis, especially since this cooperation is enabling of significant aspects of the invention. As has been already indicated the primary and secondary mask sets even though coexistent on the transistor under fabrication during certain portions of the fabricate process are made from different materials, materials which are of widely varying and therefore highly useful characteristics in the transistor fabrication process. The primary mask for example is made from photosensitive or photoresist material, material which is responsive to light exposure and responsive to the usual organic solvent liquids such as acetone and MIBK, Chlorobenzene. The secondary mask in contrast is made from silicon nitride or similar inorganic materials and is therefore not responsive to either light exposure or organic solvents and is removed with the aid of a reactant which is largely inert with respect to the semiconductor materials surrounding it. These contrasts in sensitivity and reaction response are of course usable to considerable convenience in the described fabrication sequences.

These diverse properties in two concurrently used masks in the present invention are therefore selected in order to enable the accomplishment of such features as a one mask determination of gate region geometry in a fabricated transistor, etching removal of selected areas of the primary mask by way of apertures existing in the secondary mask and excess deposited metal lift-off (including its supporting photoresist mask) while one mask, the secondary mask, remains in permanent (and useful) position. In a larger sense it is this use of two contrasted material independent masks which enables the present use of a single metallization for ohmic and Schottky contacts to the transistor under fabrication.

In referring here to diverse properties in two concurrently used masks it is of course intended that the primary and secondary masks 315 and 328 in FIG. 3 are under consideration as opposed to the two differing masks (each of photoresist material) employed in the above referred-to EBOL lithography sequence. These EBOL masks are made of differing photoresist materials in order to be properly responsive to the differing exposures of an electron beam and a two wavelength optical exposure. The two materials employed in these masks are nevertheless each responsive to photo exposure sequences and removable with organic solvents in contrast to the differing properties of the intended secondary masks. In reality moreover the two EBOL masks may be considered to be component parts of what is termed the "primary mask".

FABRICATED DEVICES

Figure 7:
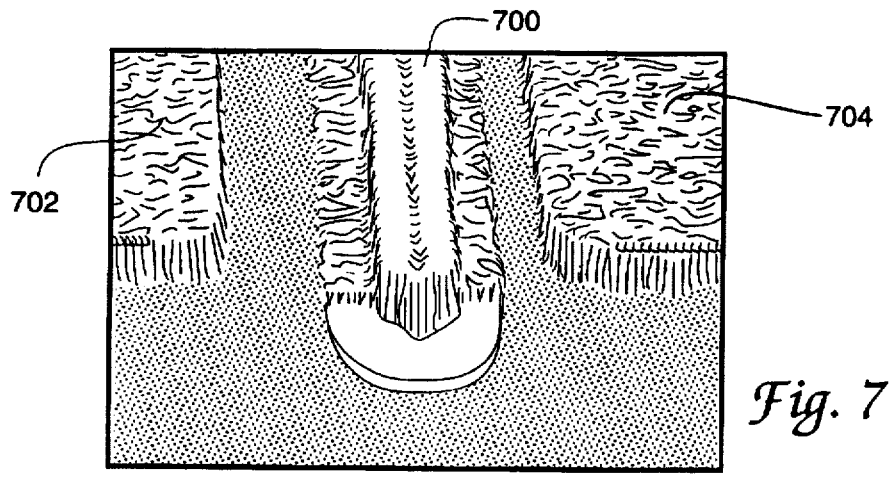
FIG. 7 shows a drawing representation of a partial cross sectional microphotograph of a transistor according to the invention.
Figure 8:
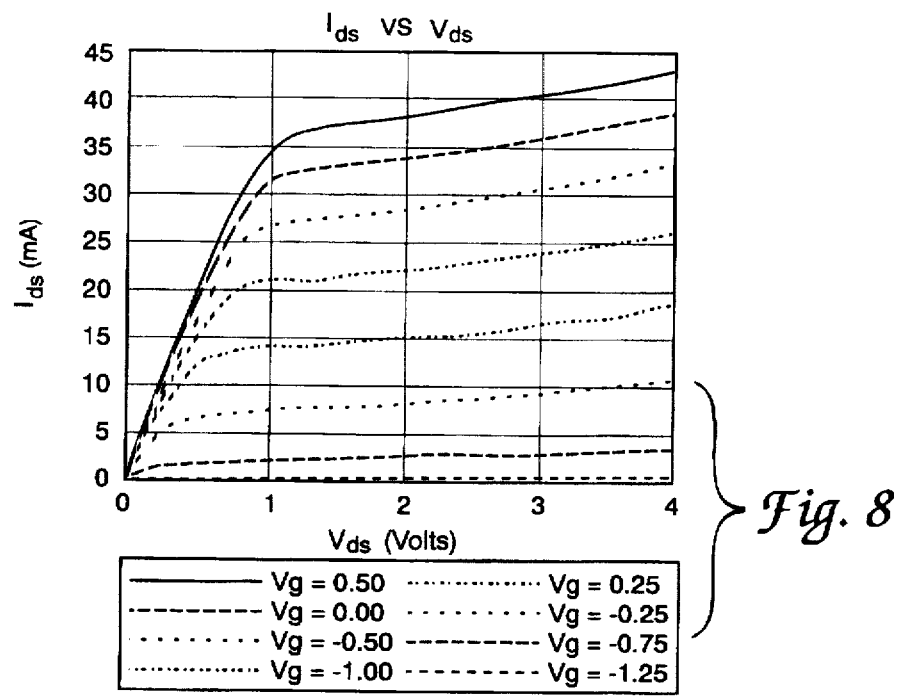
FIG. 8 shows the current versus voltage characteristics for a field-effect transistor according to the invention.
Figure 9:
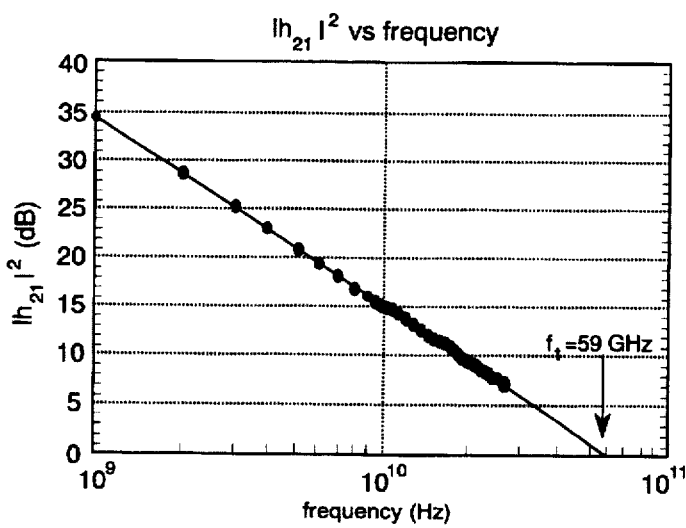
FIG. 9 shows a frequency response relationship for a field-effect transistor according to the invention.

A drawing representation of a microphotograph of a MESFET device of 0.2 micrometer gate length and fabrication according to the present invention appears in FIG. 6 of the drawings. A drawing representation of a cross-sectional scanning electron microscope microphotograph of this same device appears in FIG. 7 of the drawings. In the FIG. 7 representation the endmost portion of a gate contact element appears at 700 and source and drain contacts at 702 and 704 for example. The following paragraphs of fabricated device description relating to these drawings are paraphrased from the published technical conference article "A Highly Manufacturable 0.2 μM AlGaAs/InGaAs PHEMT Fabricated Using the Single-Layer Integrated-Metal FET (SLIMFET) Process" authored by Charles K. Havasy et al., and presented at the 17th annual Institute of Electrical and Electronic Engineers Gallium Arsenide Integrated Circuit Symposium, San Diego, Calif., Oct. 29–Nov. 1, 1995. These paragraphs describe the electrical characteristics of FET devices resulting from a fabrication according to the above-described sequence. Drawing Figure numbers bearing the asterisk (*) notation of course refer to published article Figure numbers, which are omitted herein, rather than to present document Figure numbers.

Figure 4:
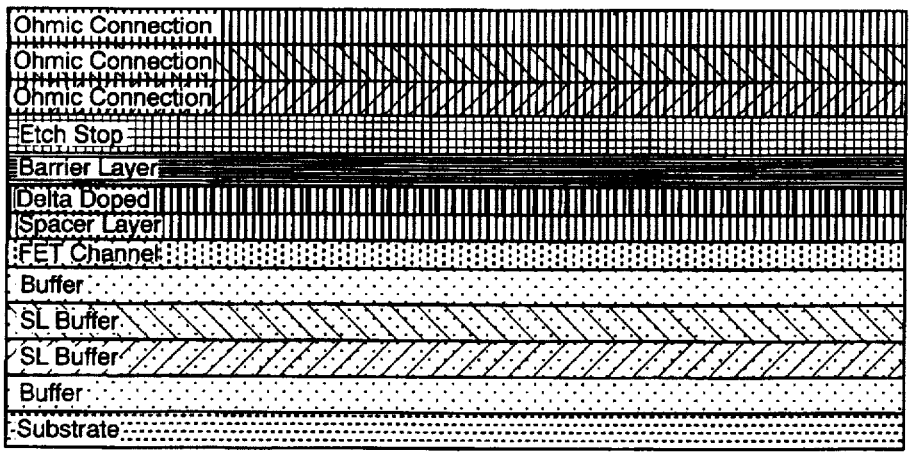
FIG. 4 shows a PHEMT type field-effect transistor which includes each of the layers identified in Table 1 herein.

GaAs PHEMT devices having the structure shown in FIG. 2 were fabricated using the described SLIMFET process. A scanning electron microscope (SEM) micrograph of a completed PHEMT device is shown in FIG. 3*. The single layer metallization of the drain, gate, and source contacts result in the absence of a metal step from the contact to interconnect layer in these drawings. In FIG. 4*, a SEM micrograph of the gate cross section shows the "mushroom" shape of the gate and the ensuing 0.2 μm gate length achieved through e-beam lithography with the described resist combination appears.

After the metallization step, ohmic contact resistance was measured using standard transmission line model (TLM) patterns. These devices achieved an average contact resistance of 0.164 ohm*mm, specific contact resistance of $4.13 \times 10^{-7}$ ohm.cm$^2$, and sheet resistance of 169.62 ohm/square for non-alloyed Ti/Au metal on the InAs/In$_x$Ga$_{1-x}$As contact layers. These results compare well with earlier results from standard GaAs and other InGaAs ohmic contact layers.

Both DC and RF testing was completed for these devices. A family of I–V curves for a fabricated 50 μm wide, two finger, center tapped PHEMT with 0.2 μm gate length is shown in the drawing of FIG. 5*. The saturated drain-source current (Idss) averaged 195.6 mA/mm, with a peak transconductance of 319.83 mS/ram at a gate voltage of −0.55 V. The pinch off voltage was measured to be −1.25 V. S-parameter testing was performed from 1 to 26 GHz. The extrapolated cutoff frequency (f$_t$) is a maximum of 59 GHz, and is shown in FIG. 6*. This result is comparable to standard PHEMTs fabricated using a conventional process.

Table 2 below provides a comparison between the steps used in a conventional field-effect transistor fabrication process and the process of the present invention. Although a first blush review of this comparison table may suggest the present invention steps are almost as numerous as those of the previous process, a detailed consideration of the data in this table reveals that several of the present invention steps can also be accomplished more quickly—by a considerable margin, than is possible in the more conventional process.

TABLE 2

| SLIMFET Process | Standard FET Process |
|---|---|
| 4 Lithographhy Steps: | 5 Lithography Steps: |
| Mask Alignment | Mask Alignment |
| Device Isolation | Device Isolation |
| Gate Window | Ohmic Metal |
| Ohmic/Gate Feed/Pad/Gate Metal | Gate Feed & Contact Pad Metal |
|  | Gate Metal |
| 2 Metal Depositions and Metal Lift-Off Steps | 4 Metal Depositions and Metal Lift-Off Steps |
| Mask Alignment Marks (Ti/Au) | Mask Alignment Mask (Ti/Au) |
| Ohmic/Contact Pats/Gate (Ti/Au) | Ohmic Contacts (AuGe/Ni) |
|  | Gate Feed & Contact Pads (Ti/Au) |
|  | Gate Contacts (Ti/Au) |
| 0 Metal Alloys | 1 Metal Alloy |
| 1 Si$_3$N$_4$ Deposition | 0 Si$_3$N$_4$ Depositions |
| 3 Selective Etch Steps | 1 Selective Etch Step |
| Gate Window | Gate Recess |
| Gate Recess |  |
| Si$_3$N$_4$ for Ohmic Contacts |  |

In particular the elimination of steps involving metallization, and its attending lithography, from the SLIMFET process represent notable fabrication time and cost savings. The hours involved in accomplishing an accurate mask alignment, the time to evacuate a metallization chamber, the time to accomplish the metallization, and then the time to relieve the vacuum at a controlled rate typically combine to limit fabrication throughput when multiple metallizations are involved for a device. Many etching steps in comparison are of significantly lower cost than a metallization step and therefore are of less significance in device fabrication time and bottom line cost. In considering the Table 2 comparison of the present SLIMFET process with a conventional process therefore these "second blush" detailed factors also merit consideration.

By way of additional comparisons relating to the present invention, it is recognized that conventional transistors of the type described herein make use of the well known gold germanium nickel ohmic contacts and thereby achieve what is considered to be desirable low electrical resistance at these contacts. It is further recognized that the presently espoused use of Schottky metallization, i.e., the herein disclosèd titanium platinum gold or platinum gold alloys for example for this ohmic contact function, may be considered an area of device performance compromise, compromise in that somewhat higher source and drain contact resistance can result. With the herein disclosed arrangement of the ohmic contact semiconductor layers of the transistor, this tendency toward greater contact resistance is however, limited to a degree believed acceptable in many field-effect transistor uses.

The reward for acceptance of any compromise of this nature is of course realized in the simplification of device processing, probably increased wafer yields and the resulting decrease; in device cost. The employment of a single metallization step is of course a notable area of present processing simplification. A significant enabling factor in achieving this single metallization involves use of the relatively inert secondary mask element and the separation of gate region fabrication steps from source and drain region fabrication steps it makes possible.

Another area of present processing simplification which may be viewed as the acceptance of device-impacting compromise resides in the area of combined electron beam and optical lithography steps in a single device. While conventional wisdom may suggest that the maintenance of separation between processes involving these two exposure arrangements is desirable to avoid their compromising interaction, the present inventors believe the combination of these exposures as disclosed herein and in the literature is sufficiently well tuned so as to have little negative effect on the resulting devices.

The herein disclosed SLIMFET process and transistor are the result of combining several processing technologies. These include electron-beam/optical lithography (EBOL), selective gate recess etching including a non photoresponsive secondary mask, single metallization and non-alloyed ohmic contacts. The EBOL process defines all the metal regions of the transistor, without sacrificing either lithography speed or feature resolution.

Another process enhancement concerns a selective gate recess etch, which allows for unusually desirable control of the gate etch. Typically, gate recess etching is performed in an iterative, "etch to a target current" process. The SLIMFET process however, discloses a gate etch that can be accomplished without probing the ohmic contacts and thereby allows the ohmic contacts to be covered with protective $Si_3N_4$ during the gate recess etch. Additionally, the SLIMFET process prevents problems with metal step coverage or metal to metal overlap, problems whose elimination relate dosely to yield improvement.

Another feature of the disclosed fabrication is the use of a non-alloy ohmic metal process which further improves device uniformity and eliminates an undesirable high temperature processing sequence. The SLIMFET process also requires only one dielectric deposition step instead of two as in the best existing technique. Metal definition in the disclosed SLIMFET process is by lift-off and not by the more expensive ion milling. This metal lift-off requires no expensive equipment, and does not introduce damage or transistor performance degradation. Finally, the employed process for this device is also compatible with monolithic microwave integrated circuit (MMIC) and other fabrication techniques and minimizes process variations, cycle time, and cost.

The present invention is therefore believed to represent the first ever AlGaAs/InGaAs HEMT/PHEMT fabricated using a single layer metallization scheme for both the Schottky gate and ohmic contacts. The fabricated device achieves a cut-off frequency of 59 GHz for sub 0.5 micron gate length, which represents state-of-the-art performance in single metal transistors. The SLIMFET process is again achieved through the integration of: the electron-beam/optical lithography process, selective gate recess etching, and non-alloyed ohmic contacts. The SLIMFET process greatly simplifies the fabrication of FET devices while minimizing process variations. The described process is also believed feasible for lower frequency amplifier transistors.

While the apparatus and method herein described constitute a preferred embodiment of the invention, it is to be understood that the invention is not limited to this precise form of apparatus or method and that changes may be made therein without departing from the scope of the invention which is defined in the appended claims.

What is claimed is:

1. A partially fabricated group III–V semiconductor material field-effect transistor comprising the combination of::
    a lowermost-situated group III–V semiconductor material substrate layer;
    a group III–V semiconductor material buffer layer overlaying said substrate layer;
    a charged carrier conveying group III–V semiconductor material channel layer overlaying said buffer layer;
    a group III–V semiconductor material barrier layer, of larger energy bandgap semiconductor material than said channel semiconductor material layer, overlaying said channel layer;
    a layer of ohmic contact group III–V semiconductor material, of metal-like small energy bandgap, overlaying said barrier layer;
    a gate contact member of first metallic composition received on said barrier layer in a gate aperture recession region of said ohmic contact layer, said first metallic composition gate contact member being of a Schottky barrier electrical characteristic with respect to said barrier layer semiconductor material;
    source and drain contact members of said same first metallic composition received on said ohmic contact group III–V semiconductor material layer in laterally opposed locations with respect to said gate contact member, said source and drain contact members being of an inherently ohmic and linear current-voltage electrical characteristic with respect to said semiconductor material of said ohmic contact layer;
    an electrical insulating/secondary mask/photo-insensitive passivation layer received over said ohmic contact group III–V semiconductor material layer in regions surrounding said source, drain and gate contact member recessions;

a photoresist primary mask member layer received over said electrical insulating/secondary mask/photo-insensitive passivation layer in regions surrounding said source, drain and gate contact member recessions;

a metallic conductor layer of said same first metallic composition incidentally overlaying said photoresist primary mask member layer in regions surrounding said source, drain and gate contact member recessions.

2. The field-effect transistor of claim 1 further including a thin group III–V semiconductor material inclusive etch stop layer received intermediate said ohmic contact group III–V semiconductor material layer and said group III–V semiconductor material barrier layer in regions surrounding said gate contact member recession.

3. The field-effect transistor of claim 2 wherein said group III–V semiconductor material is gallium arsenide material and said etch stop layer is comprised of one of the materials of aluminum gallium arsenide of aluminum mole fraction in excess of twenty percent and aluminum arsenide.

4. The field-effect transistor of claim 3 wherein said aluminum arsenide material of said etch stop layer is thirty angstroms in thickness and includes silicon doping to a concentration of five times ten to the seventeenth power atoms per cubic centimeter.

5. The field-effect transistor of claim 1 wherein said group III–V semiconductor material is gallium arsenide and said layer of ohmic contact group III–V semiconductor material includes both a lower level to upper level composition-graded layer of indium gallium arsenide semiconductor material and an indium arsenide layer of one times ten to the nineteenth power indium atoms per cubic centimeter.

6. The field-effect transistor of claim 1 wherein said photoresist primary mask member layer received over said electrical insulating/secondary mask/optically inert passivation layer comprises a first layer of a first photoresist material having opacity to a first type of radiant energy and a second layer of a second photoresist material having opacity to a second type of radiant energy.

7. The field-effect transistor of claim 6 wherein said gate contact element includes a gate length dimension of less than one micron and wherein said primary mask member layers includes a photoresist material having opacity to an electron beam and a photoresist material having opacity to optical energy.

8. The field-effect transistor of claim 1 wherein:

said group III–V semiconductor material is gallium arsenide;

said channel layer is comprised of one of the materials of gallium arsenide and indium gallium arsenide;

said ohmic contact layer is comprised of one of the materials of gallium arsenide, indium gallium arsenide and indium arsenide; and said contact members of first metallic composition are comprised of one of the metal combinations of titanium and gold; and titanium platinum and gold.

9. The field-effect transistor of claim 1 wherein said group III–V semiconductor material buffer layer is comprised of one of the materials of undoped gallium arsenide, and undoped aluminum gallium arsenide.

10. The field-effect transistor of claim 1 wherein each of said elements and layers through said electrical insulating/secondary mask/optically inert passivation layer are permanent elements of said field-effect transistor and said photoresist primary mask member layer and said lift off metallic conductor layer are each fabrication-related temporary layers subject to removal during completion processing of said field-effect transistor.

11. The field-effect transistor of claim 1 wherein said group III–V semiconductor material is gallium arsenide and said electrical insulating/secondary mask/optically inert passivation layer is comprised of silicon nitride material.

12. The field-effect transistor of claim 1 wherein said group III–V semiconductor material is Indium Phosphide.

13. Field effect transistor apparatus comprising the combination of:

a plurality of grown semiconductor material layers received on a substrate member, said grown semiconductor material layers including an uppermost selected one of a field-effect transistor channel layer and a barrier layer-covered field-effect transistor channel layer;

an etch stop semiconductor material first masking layer permanently received over said selected one layer;

a gate member of first metallic composition received on said selected layer in a gate aperture region of said etch stop first masking layer, said gate member having Schottky barrier electrical characteristics with respect to said transistor channel layer semiconductor material;

a layer of graded semiconductor material overlaying said selected layer in gate aperture-interrupted regions adjacent said gate member;

a layer of ohmic contact semiconductor material overlaying said graded semiconductor material layer in gate aperture-segregated regions adjacent said gate member;

said plurality of grown semiconductor layers, said etch stop semiconductor material layer, said layer of graded semiconductor material and said layer of ohmic contact semiconductor material being disposed in single crystal alignment, source and drain contact members of said same first metallic composition received in non-alloyed contact on said ohmic contact semiconductor material layer in laterally opposed locations with respect to said gate member, said source and drain contact members having ohmic electrical characteristics with respect to said semiconductor material of said ohmic contact layer;

a secondary mask and passivation layer overlaying said layer of ohmic contact semiconductor material in regions surrounding said gate aperture region and said source and drain members.

14. Field effect transistor apparatus comprising the combination of:

a lowermost-situated semiconductor substrate layer member;

a plurality of grown semiconductor material layers successively overlaying said substrate layer member, said grown semiconductor material layers including an uppermost selected one of a field-effect transistor channel layer and a barrier layer-covered field-effect transistor channel layer;

an etch stop semiconductor material layer received over said selected layer;

a gate contact member of first metallic composition received on said selected layer in a gate aperture region of said etch stop layer, said gate contact member having Schottky barrier electrical characteristics with respect to said transistor channel layer semiconductor material;

a layer of graded semiconductor material overlaying said selected layer in gate aperture-interrupted regions adjacent said gate member;

a layer of ohmic contact semiconductor material overlaying said graded semiconductor material layer in gate aperture-segregated regions adjacent said gate contact member;

said semiconductor material layers being disposed in single crystal alignment; source and drain contact members of said same first metallic composition received on said ohmic contact semiconductor material layer in laterally opposed locations with respect to said gate contact member, said source and drain contact members having ohmic electrical characteristics with respect to said ohmic contact layer semiconductor material;

a permanent secondary mask layer overlaying said layer of ohmic contact semiconductor material in regions surrounding said gate aperture region and said source and drain contact members.

15. The field-effect transistor apparatus of claim 14 wherein said field-effect transistor is one of a high electron mobility transistor and a pseudomorphic high electron mobility transistor and said uppermost selected one of a field-effect transistor channel layer and a barrier layer-covered field-effect transistor channel layer comprises a barrier layer-covered field-effect transistor channel layer.

16. The field-effect transistor apparatus of claim 15 wherein said semiconductor materials comprise periodic table Group III–IV semiconductor materials.

17. The field-effect transistor apparatus of claim 16 wherein said periodic table Group III–IV semiconductor materials are comprised of gallium arsenide.

18. The field-effect transistor apparatus of claim 17 wherein said permanent secondary mask layer is comprised of one of the materials of silicon nitride and silicon dioxide.

19. The field-effect transistor apparatus of claim 18 wherein:

said apparatus comprises a high electron mobility transistor;

said high electron mobility transistor includes a semiconductor material channel layer comprised of gallium arsenide semiconductor material.

20. The field-effect transistor apparatus of claim 18 wherein:

said apparatus comprises a pseudomorphic high electron mobility transistor;

said pseudomorphic high electron mobility transistor includes a semiconductor material channel layer comprised of indium gallium arsenide semiconductor material.

21. Partially fabricated field effect transistor apparatus comprising the combination of:

a lowermost-situated semiconductor substrate layer member;

a plurality of grown semiconductor material layers successively overlaying said substrate layer member, said grown semiconductor material layers including a charged carrier conveying field-effect transistor channel layer;

a layer of ohmic contact metal-like small energy bandgap semiconductor material overlaying one of said channel layer, a semiconductor material layer covering said channel layer and a semiconductor material layer covering both said channel layer and an additional transistor layer of said transistor;

said semiconductor material layers being disposed in single crystal alignment;

a non photo responsive secondary mask layer overlaying said layer of ohmic contact metal-like small energy bandgap semiconductor material;

a first photoresponsive mask layer overlaying said non photo responsive secondary mask layer;

a second photoresponsive mask layer, of differing light wavelength response and different chemical developer response characteristics from said first photoresponsive mask layer, disposed overlaying said first photoresponsive mask layer;

a first aperture extending though said second photoresponsive mask layer, said first photoresponsive mask layer, said secondary mask layer, and said ohmic contact metal-like small energy bandgap semiconductor material layer to one of said channel layer, said semiconductor material layer covering said channel layer and said semiconductor material layer covering both said channel layer and an additional transistor layer;

second and third apertures laterally disposed on opposed sides of said first aperture and extending though said second photoresponsive mask layer, said first photoresponsive mask layer and said secondary mask layer to said ohmic contact metal-like small energy bandgap semiconductor material layer.

22. The partially fabricated field effect transistor apparatus of claim 21 further including:

a first metallic contact field-effect transistor gate member of selected metallic composition received within said first aperture on one of said channel layer, said semiconductor material layer covering said channel layer and said semiconductor material layer covering both said channel layer and an additional transistor layer;

second and third metallic contact field-effect transistor source/drain members of said saline selected metallic composition received within said second and third apertures on said ohmic contact metal-like small energy bandgap semiconductor material layer.

23. The field effect transistor apparatus of claim 14 wherein said transistor includes a combination of features greater than 0.6 micron in physical size, features between 0.4 and 0.6 micron in physical size and features between 0.05 and 0.4 micron in physical size.

24. The field effect transistor apparatus of claim 23 wherein said gate contact member of first metallic composition includes physical features between 0.05 and 0.4 micron in physical size.

25. The field effect transistor apparatus of claim 23 wherein said gate contact member of first metallic composition includes a cross sectional shape of mushroom-like physical configuration.

* * * * *

UNITED STATES PATENT AND TRADEMARK OFFICE
CERTIFICATE OF CORRECTION

PATENT NO. : 5,698,870　　　　　　　　　　　　　　　　　　　　　　　Page 1 of 1
DATED : December 16, 1997
INVENTOR(S) : Kenichi Nakano et al.

It is certified that error appears in the above-identified patent and that said Letters Patent is hereby corrected as shown below:

<u>Title page,</u>
Item [57], ABSTRACT,
Line 1, "III-IV" should read -- III-V --.

<u>Column 27,</u>
Line 23, "III-IV" should read -- III-V --.
Line 25, "III-V" should read -- III-V --.

Signed and Sealed this

Second Day of April, 2002

Attest:

JAMES E. ROGAN
Attesting Officer　　Director of the United States Patent and Trademark Office